US012721244B2

(12) United States Patent
Lam et al.

(10) Patent No.: US 12,721,244 B2
(45) Date of Patent: Aug. 25, 2026

(54) WAFER-SCALE INTEGRATION WITH A STIFFENING ISOMETRIC GRID ARRAY

(71) Applicant: Volantis Semiconductor, Inc., Portland, OR (US)

(72) Inventors: Kevin Nan Lam, Pleasanton, CA (US); Tapabrata Ghosh, Oakland, CA (US)

(73) Assignee: Volantis Semiconductor, Inc., Portland, OR (US)

( * ) Notice: Subject to any disclaimer, the term of this patent is extended or adjusted under 35 U.S.C. 154(b) by 75 days.

(21) Appl. No.: 18/978,188

(22) Filed: Dec. 12, 2024

(65) Prior Publication Data

US 2026/0123553 A1 Apr. 30, 2026

Related U.S. Application Data

(63) Continuation-in-part of application No. 18/958,107, filed on Nov. 25, 2024, which is a continuation-in-part of application No. 18/940,944, filed on Nov. 8, 2024.

(60) Provisional application No. 63/720,216, filed on Nov. 14, 2024, provisional application No. 63/714,353, filed on Oct. 31, 2024.

(51) Int. Cl.

*H10W 20/00* (2026.01)
*H10W 40/22* (2026.01)
*H10W 70/63* (2026.01)
*H10W 90/00* (2026.01)

(52) U.S. Cl.

CPC ....... *H10W 90/701* (2026.01); *H10W 40/226* (2026.01); *H10W 70/635* (2026.01); *H10W 90/00* (2026.01); *H10W 90/722* (2026.01)

(58) Field of Classification Search

CPC . H10W 20/00; H10W 20/021; H10W 20/023; H10W 20/211; H10W 70/417; H10W 90/701; H10W 72/07338; H10W 72/07339

USPC ............................................ 257/678, 21.121

See application file for complete search history.

(56) References Cited

U.S. PATENT DOCUMENTS

| | | | |
|---|---|---|---|
| 9,886,193 B2 | 2/2018 | Berger et al. | |
| 10,332,931 B2 | 6/2019 | Cassidy et al. | |
| 10,546,809 B2 * | 1/2020 | Cox | H10W 72/00 |
| 10,613,754 B2 | 4/2020 | Berger et al. | |
| 11,328,208 B2 | 5/2022 | Lie et al. | |
| 12,113,042 B2 * | 10/2024 | Lu | H10W 72/851 |
| 2020/0258838 A1 | 8/2020 | Ghosh | |

* cited by examiner

*Primary Examiner* — Hai L Nguyen

(74) *Attorney, Agent, or Firm* — Adams Intellex, PLC

(57) ABSTRACT

Techniques for stiffening are disclosed. A wafer-scale silicon interposer (WSSI) is accessed. A front side of the WSSI is bonded to a plurality of functional chips. The WSSI includes a plurality of through-silicon vias (TSVs). The WSSI is stiffened. The stiffening is based on an isometric grid array (IGA). The stiffening includes inserting, into the IGA, a back side of the WSSI. The back side of the WSSI remains accessible via open recesses within the IGA. Modular power substrates (MPSs) are attached to the back side of the WSSI through the open recesses within the IGA. The MPSs are mechanically connected to a unified control board (UCB). The UCB includes a plurality of DC-to-DC power converters. The UCB sends DC power to the functional chips bonded to the WSSI that was stiffened. The sending is based on the plurality of MPSs and the plurality of TSVs.

30 Claims, 13 Drawing Sheets

700
702
734
732
720
730
742
740
712
710

WAFER-SCALE INTEGRATION WITH A STIFFENING ISOMETRIC GRID ARRAY

RELATED APPLICATIONS

This application claims the benefit of U.S. provisional patent applications "Cooling for Wafer-Scale Integration With Back Side Power Coupling" Ser. No. 63/714,353, filed Oct. 31, 2024, and "Back Side Wafer-Scale Power Delivery With An Anisotropic Film" Ser. No. 63/720,216, filed Nov. 14, 2024.

This application is also a continuation-in-part of U.S. patent application "Cold Plate Cooling For Wafer-Scale Integration With Back Side Modular Power Delivery" Ser. No. 18/958,107, filed Nov. 25, 2024, which claims the benefit of U.S. provisional patent applications "Cooling for Wafer-Scale Integration With Back Side Power Coupling" Ser. No. 63/714,353, filed Oct. 31, 2024, and "Back Side Wafer-Scale Power Delivery With An Anisotropic Film" Ser. No. 63/720,216, filed Nov. 14, 2024.

The U.S. patent application "Cold Plate Cooling For Wafer-Scale Integration With Back Side Modular Power Delivery" Ser. No. 18/958,107, filed Nov. 25, 2024 is also a continuation-in-part of U.S. patent application "Back Side Wafer-Scale Integration With Modular Power Delivery", Ser. No. 18/940,944, filed Nov. 8, 2024, which claims the benefit of U.S. provisional patent application "Cooling for Wafer-Scale Integration With Back Side Power Coupling" Ser. No. 63/714,353, filed Oct. 31, 2024.

Each of the foregoing applications is hereby incorporated by reference in its entirety.

FIELD OF ART

This application relates generally to stiffening and more particularly to wafer-scale integration with a stiffening isometric grid array.

BACKGROUND

Structures of many kinds are present throughout the world. Whether atomic structures of gases, liquids, and solids in the environment, or manmade structures that are made from mud, stone, brick, wood, steel, or glass, there are inherent physical and chemical rules that dictate properties of any material that forms a structure. These structures indeed are essential to supporting life on earth. Consider the atmosphere of our planet, Earth. The atmosphere, which can be described by layers including the troposphere, stratosphere, mesosphere, thermosphere, and exosphere, includes varying amounts of constituent gases in a mixture. The mixture includes nitrogen, oxygen, carbon dioxide, and trace elements of other gases. The atmosphere further includes water vapor, suspended aerosols, and particulates. Each of these materials found in the atmosphere is based on a structure. The oxygen in the atmosphere, for example, is comprised of two oxygen atoms that are bonded to form $O_2$. The water vapor in the atmosphere is based on two hydrogen atoms and one oxygen atom. The atoms that form water are bonded at an angle of approximately 104 degrees to each other and fixed at a distance of approximately 0.1 nm. The water vapor in the atmosphere is obtained from the oceans that cover much of Earth's surface. The particulates present in the atmosphere result from natural causes such as fires, volcanic eruptions, and dust from landmasses. The particulates in the atmosphere further result from human-based causes such as combustion of a wide variety of fuels.

The materials that form the atmosphere, the oceans, and the landmasses have been used by humans to build structures for shelter, safety, and security. One material that has long be used by humans for shelter is cob. Cob is a mixture of clay, sand, straw, and water that can be formed into bricks or blocks. When dried, cob bricks can be assembled into structures for housing and storage. Wood has long been a popular material for building larger land-based structures such as larger and taller houses and barns. Wood has also been used for various types of watercraft, ranging from simple rafts to complex ships used for trade and warfare. As the sizes of buildings and watercraft increased, stronger and more durable materials were used. Brick, stone, steel, and glass became common for buildings, and steel ships proved more durable, particularly in hostile environments and in battle situations. However, with the creation of ever larger structures, the design of the structures became critical in order to prevent their collapse. The structures required carefully designed supports that enabled the structures to be more robust and provided reinforcement and stabilization to the structures. The supports can be found in the steel structures that support skyscrapers and the reinforcing ribs of ships. In the future, materials will continue to be required for reinforcing structures for various uses.

SUMMARY

Business operators, consumers, researchers, and scientists have long demanded computers and consumer devices that are faster and more capable than prior generations of similar devices. In order to meet these market pressures, circuit designers have long been driven to design and fabricate integrated circuits with ever-increasing processing performance, expanded data processing options, and "product differentiating" features. The latter now commonly include larger touchscreens, higher resolution cameras, spatial audio, and biometric sensing, among many others. However, increasing processing speed and capability by introducing advanced parallel processing architectures, incorporating graphics processors, or including neural engines force the addition of complex and potentially large circuitry to the chips. To add new circuitry into chips, designers have long explored two main options: increase the chip dimensions by making it larger or increase circuit density by reducing feature sizes. Ideally, the chip would be the size of an entire wafer, and the feature sizes would include reduced wire widths and separation, smaller transistor sizes, minimum contact sizes, and reductions of all other dimension related to circuity.

Engineers have continued to increase circuit density and to place more transistors on a chip in order to meet to never-ending demands for increased performance. Further, engineers are attempting to produce chips that are closer to the size of an entire wafer on which the chips are fabricated. As a result, microprocessors, graphics processors, machine learning accelerators, systems-on-chips (SoCs), and so on currently boast transistor counts into the tens of billions. Commensurate with increasing performance, these improvements and added devices increase the power density of the chips, resulting in significant heat generation. Further, to increase interconnection options, designers have considered through-silicon vias to provide direct connections between a front side of a chip (wafer) and a back side of a chip. However, to reliably fabricate such interconnect, the wafers, for example, must be ground or polished to a thinness that supports the fabrication of the through-silicon vias. As a result, the thinned chips are prone to cracking and fracturing, not only because of the delicate nature of the materials of the wafer, but also because of the weights of any elements bonded to, attached to, or otherwise connected to the wafers. Thus, support of the wafers to prevent damage or failure has become paramount.

Disclosed techniques enable stiffening for wafer-scale integration with stiffening isometric grid array. A wafer-scale silicon interposer (WSSI) is accessed. A front side of the WSSI is bonded to a plurality of functional chips. The WSSI includes a plurality of through-silicon vias (TSVs). The plurality of TSVs enable connections between a front side of the WSSI and a back side of the WSSI. The WSSI is stiffened. The stiffening is based on an isometric grid array (IGA). The stiffening includes inserting, into the IGA, a back side of the WSSI. The back side of the WSSI remains accessible via a plurality of open recesses within the IGA. A plurality of modular power substrates (MPSs) is attached to the back side of the WSSI, through the plurality of open recesses within the IGA. The plurality of MPSs is mechanically connected to a unified control board (UCB). The UCB includes a plurality of DC-to-DC power converters. DC power is sent by the UCB to the plurality of functional chips bonded to the WSSI that was stiffened. The sending is based on the plurality of MPSs and the plurality of TSVs.

A method for stiffening is disclosed comprising: accessing a wafer-scale silicon interposer (WSSI), wherein a front side of the WSSI is bonded to a plurality of functional chips, wherein the WSSI includes a plurality of through-silicon vias (TSVs); stiffening the WSSI, wherein the stiffening is based on an isometric grid array (IGA), wherein the stiffening includes inserting, into the IGA, a back side of the WSSI, and wherein the back side of the WSSI remains accessible via a plurality of open recesses within the IGA; attaching, to the back side of the WSSI, through the plurality of open recesses within the IGA, a plurality of modular power substrates (MPSs); connecting mechanically the plurality of MPSs, to a unified control board (UCB), wherein the UCB includes a plurality of DC-to-DC power converters; and sending DC power, by the UCB, to the plurality of functional chips bonded to the front side of the WSSI that was stiffened, wherein the sending is based on the plurality of MPSs and the plurality of TSVs.

Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
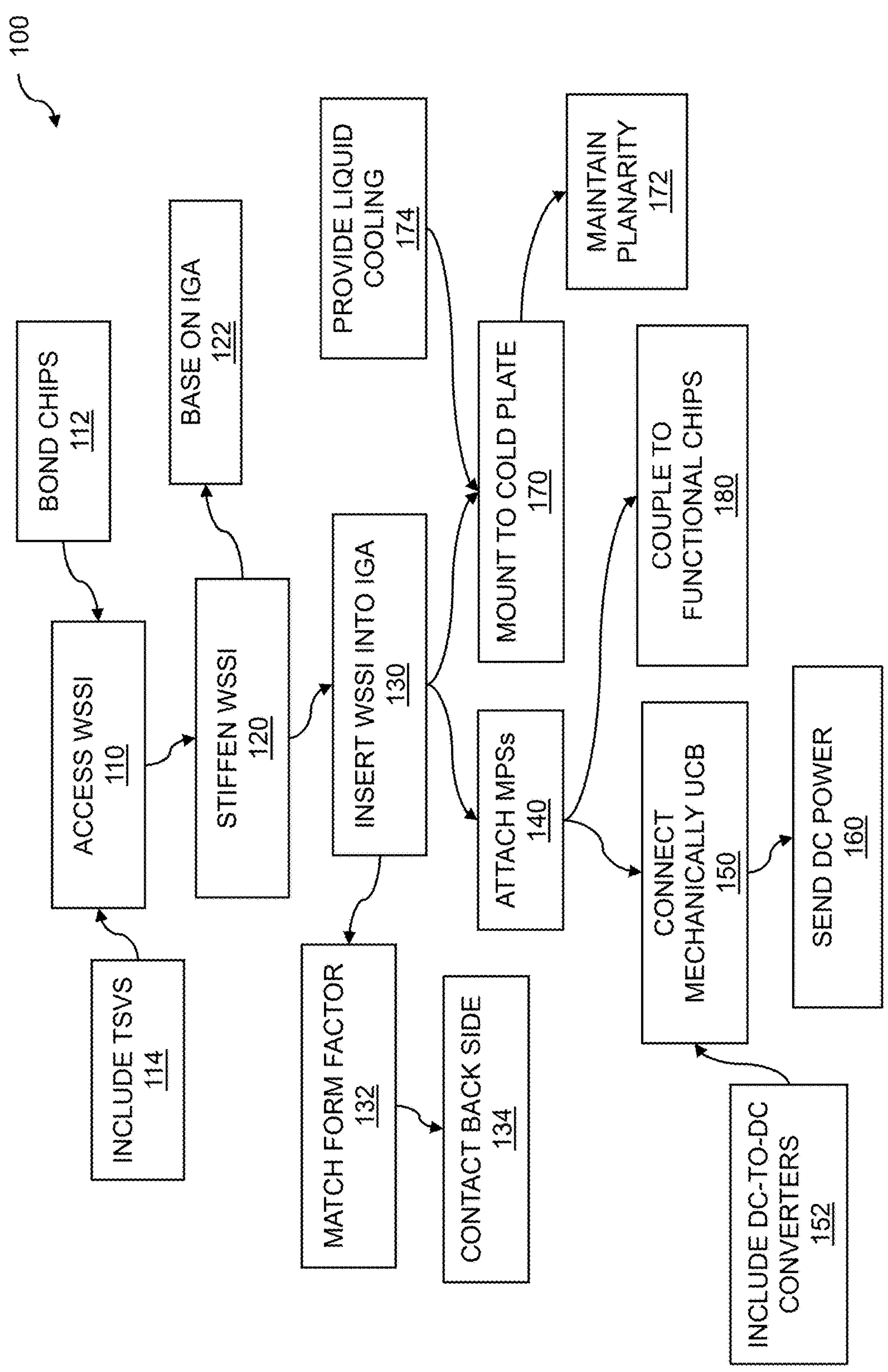
FIG. 1 is a flow diagram for wafer-scale integration with stiffening isometric grid array.

Techniques using wafer-scale integration with a stiffening isometric grid array are disclosed. Demand for improved processing performance has soared, correlating with the development of new applications for processors, accelerators, and so on. This demand is placing immense pressure on designers to develop next generation chips that can power computers, servers, cloud servers, large language model (LLM) engines, etc. To meet these demands, vastly increased numbers of transistors have been added to chips such as systems-on-chip (SOCs). SOCs can include a wide range of circuitry which can include processors, memories, I/O circuits, and other elements. These SOCs can be large, possessing tens of billions of transistors. At the same time, the feature sizes of the transistors used for these large chips continue to shrink. In fact, according to Moore's law, the number of transistors that can fit into the same size chip should double every two years. While at some point, this may end as the limits of lithography and physics are approached, in general, the "law" has held true for the last several decades. While keeping chip sizes roughly the same size is good news, new technologies that drive smaller transistors also impose new challenges on designers. For example, as a transistor shrinks, leakage currents can increase, driving larger power consumption for the chip. This effect, in combination with the active power required for billions of transistors, can drive extremely high power densities for processors and other computing elements. In addition, the wafers on which these large chips are fabricated are delicate. The wafers can crack, and the fracture is not properly handled and supported.

The immense increase of interest in and use of artificial intelligence (AI) applications, such as large neural networks, transformers, and so on, can require hundreds or even thousands of processing elements. The processing elements handle the perhaps trillions of computations required by the AI applications. These processing elements can include processor cores, multiprocessor cores, matrix accelerators, SOCs, and so on. While multiple cores such as processor cores and memory cores can be included on the same chip, many chips are required for executing these computationally intensive applications. The processing chips can be in communication locally and remotely. The processing chips are typically coupled via cards, racks, and data centers. The chips, when taken together, introduce significant design challenges such as the aggregate weight of the chips and other elements, the cooling of all these chips, etc. For example, cooling has become a complex challenge, especially when thermal design power (TDP), a measurement of the maximum power consumed by a chip under normal operating conditions, continues to increase.

Technologies are being developed to improve performance of AI applications and models. For example, wafer-scale integration is an approach that holds promise to address the performance requirements, and especially the data transfer bandwidth needs, of AI and other applications. Wafer-scale integration can include using a wafer as an interposer to couple many functional chips. The chips can include AI accelerators; processors; SOCs; application-specific integrated circuits (ASICS); memory chips such as SDRAM, DDR1, DDR2, DDR3, DDR4, DDR5 and high bandwidth memory (HBM); and so on. The functional chips can be coupled by wiring paths within the wafer interposer. The wafer interposer can be processed using a back-end-of-line (BEOL) wafer process which can include any number of metal layers. These metal layers can be used to couple any AI accelerator to any memory controller on the interposer. The wafer metal layers can provide extremely high bandwidth communication between any memory controller and any AI processor on the wafer, due in part to short communications paths. While such technology can address the performance challenges associated with extremely high compute and bandwidth applications such as AI acceleration, challenges exist for their use in production. For example, a wafer interposer can be brittle and difficult to handle, especially with a plurality of functional chips bonded to a front side. Further, the coplanarity of the wafer interposer can vary, resulting in less than optimal electrical connections across the front side and back side. Grinding, which can enable technologies such as through-silicon vias (TSVs) can thin the wafer interposer, making it still more difficult to handle without cracking. These issues present a substantial technical challenge for the handling, assembly, and operation of wafer interposers.

To address the significant risks to the wafer interposer described above, wafer-scale integration with a stiffening isometric grid array is disclosed. A wafer-scale silicon interposer (WSSI) is accessed. A front side of the WSSI is bonded to a plurality of functional chips. The WSSI includes a plurality of through-silicon vias (TSVs). The TSVs provide connectivity between a front side of the WSSI and a back side of the WSSI. The WSSI is stiffened, where the stiffening is based on an isometric grid array (IGA). The stiffening includes inserting, into the IGA, a back side of the WSSI. The back side of the WSSI remains accessible via a plurality of open recesses within the IGA. The open recesses can be based on a variety of shapes and sizes. A plurality of modular power substrates (MPSs) is attached to the back side of the WSSI through the plurality of open recesses within the IGA. The plurality of MPSs is mechanically connected to a unified control board (UCB). The UCB includes a plurality of DC-to-DC power converters. The DC-to-DC power converters can convert a higher DC voltage to a lower DC voltage. The lower voltage can enable operation of the functional chips on the WSSI. DC power is sent by the UCB to the plurality of functional chips bonded to the WSSI that was stiffened. The sending is based on the plurality of MPSs and the plurality of TSVs. The sending includes delivering the DC power, by the UCB, to the plurality of MPSs. The delivering includes a first voltage conversion. The DC power that was delivered, by the plurality of MPSs, is transferred to the plurality of functional chips. The transferring includes a second voltage conversion. The second voltage conversion can produce a DC voltage below a threshold such as 1 volt.

A cold plate can be attached to the plurality of functional chips to cool the functional chips. The cold plate comprises an inlet plate, a jet-plate, and a fin-plate. Coolant at a first temperature can be sent into at least one inlet nozzle located on the inlet plate. The sending can include spraying the coolant, by the jet-plate, on the fin-plate. At least a portion of the heat that was created can be transferred, by the cold plate, to the coolant that was sent. The coolant can be captured, at a second temperature, from one or more outlet chambers within the jet-plate.

FIG. 1 is a flow diagram for wafer-scale integration with a stiffening isometric grid array. The flow 100 includes accessing a wafer-scale silicon interposer (WSSI) 110. Wafer-scale integration has been a long-sought goal of integrated circuit design. Wafer-scale integration can enable use of an entire wafer such as a silicon wafer on which one large integrated circuit could be fabricated. However, since physical defects in the silicon wafer are distributed across the wafer, portions of circuitry which were fabricated over the defects would likely not function properly. In addition, errors that occur when fabricating the many layers that form the integrated circuit further create portions of the integrated circuit that would likely not function. Instead, by attaching or bonding a plurality of integrated circuits to the WSSI, wafer-scale integration can be achieved. In this case, the wafer can be used as an interposer to couple the integrated circuits. The wafer can be a 300 mm wafer, a 200 mm wafer, or a wafer of another size. The wafer can comprise silicon or another suitable material. In a usage example, another suitable material can include glass. The wafer can include any amount of front-end-of-line (FEOL) processing and/or back-end-of line (BEOL) processing. The processing can be based on Complementary Metal-Oxide-Semiconductor (CMOS), Silicon on Insulator (SOI), or another process.

In the flow 100, a front side of the WSSI is bonded to a plurality of functional chips 112. The WSSI can have a front side and a back side onto which elements such as the functional circuit elements can be attached or bonded. The functional chips can include general purpose chips such as processor chips, multiprocessor chips, graphics processor chips, application-specific integrated circuits (ASICS), memory chips, and so on. In embodiments, the plurality of functional chips includes one or more artificial intelligence (AI) accelerators. The AI accelerators can be used for applications such as machine learning; natural language processing; image, video, and audio processing; etc. In embodiments, the plurality of functional chips includes one or more memory devices. In the flow 100, the WSSI includes a plurality of through-silicon vias (TSVs) 114. A TSV can include an electrical connection that completely passes through a wafer such as a silicon wafer, a glass wafer, a die, and so on. The plurality of TSVs is oriented vertically in order to enable connections between the front side of the wafer and the back side of the wafer. Chips such as the functional chips can be positioned such that connections to the chips align with the TSVs. In some examples, a wafer can be ground to enable TSV processing with repeatable shapes and parasitic characteristics.

In exemplary implementations, the WSSI can comprise monolithic wafer. The monolithic wafer can include a plurality of functional cores that are fabricated on the wafer. The functional cores can include one or more processors, AI accelerators, ASICS, peripheral interfaces, and so on. The functional cores can include memory. Other memory elements, such as SRAM, can be included in the monolithic wafer. The memory elements can also be fabricated on the wafer. Interconnect can be included on the monolithic wafer to couple any number of the functional cores, memory elements, and so on. The interconnect can comprise any number of metal layers on the wafer.

The flow 100 includes stiffening 120 the WSSI. The stiffening can be accomplished by bracing, supporting, etc. the WSSI. The stiffening can be accompanied using a brace, a frame, a supporting structure, and so on. In the flow 100, the stiffening is based on an isometric grid array (IGA) 122. The IGA can be positioned such that the IGA is in contact with the WSSI. The contacting the WSSI by the IGA can stiffen the WSSI. In embodiments, the IGA comprises a grid. The grid can include a plurality of open recesses, where the open recesses can include one or more shapes. In a usage example, the IGA can include open recesses that include equally sized shapes, such as squares. The open recesses can include rectangles, circles, ovals, honeycombs, etc. Each gridline within the grid can be chosen to have a dimension or "thinness" that enables stiffening of the WSSI while minimizing an amount of WSSI real estate obstructed by the IGA. In a usage example, the gridlines of the grid can include a thickness of 1 mm or less.

In the flow 100, the stiffening includes inserting 130, into the IGA, a back side of the WSSI. The back side of the WSSI remains accessible via a plurality of open recesses within the IGA. The access provided by the open recesses within the IGA enable mounting, attaching, etc. further elements to the WSSI. The further elements can be attached to the back side of the WSSI. The flow 100 includes attaching 140, to the back side of the WSSI, through the plurality of open recesses within the IGA, a plurality of modular power substrates (MPSs). The MPS can include power elements such as DC-to-DC converters, connectors such as high power connectors, further connectors such as rigid-flex strips, and so on. The DC-to-DC converters associated with the MPSs can provide power to functional chips. In embodiments, each DC-to-DC converter in the plurality of DC-to-DC power converters is coupled to one or more functional chips in the plurality of functional chips. The MPSs can receive DC power, where the DC power can be sent by a control board such as a unified control board (discussed below). The DC power that is received by the plurality of MPSs can be transferred to the plurality of functional chips. The transferring can be based on a voltage conversion such as a DC voltage conversion.

In embodiments, each MPS within the plurality of MPSs is based on a form factor mirroring one or more corresponding functional chips within the plurality of functional chips on the front side of the WSSI. The form factor can be based on or more parameters associated with the one or more corresponding functional chips. In a usage example, the form factor can be based on a coefficient of thermal expansion (CTE). Recall that the functional chips can generate copious heat while operating. Physical components such as substrates, WSSIs, etc. can expand when heated based on a coefficient of thermal expansion associated with each material. A coefficient of thermal expansion of the UCB can be different than a coefficient of thermal expansion of the WSSI. The difference in expansion coefficients can cause connectors to disconnect, C4s to crack, physical strain within materials that can cause damage, etc. Thus, if the UCB is directly mechanically connected to a WSSI, the lateral displacement due to differences in thermal expansion can cause mechanical failure. Choosing an appropriate form factor for the MPSs can reduce risks of cracking and fracturing the WSSI due to differing CTEs associated with the functional chips bonded to the front side WSSI and the MPSs attached to the back side of the WSSI. Further, the modularity of the MPSs can provide a flexible power delivery system to the functional chips which can accommodate different movements of the WSSI and UCB due to thermal expansion. For example, an MPS at one side of the WSSI can be decoupled from an MPS on the other side of the WSSI, thus accommodating various movements across the WSSI and UCB. Further, the use of compliant connectors and rigid-flex strips (explained below) between the MPSs and the UCB can be used to better tolerate lateral displacement caused by CTE differences.

In the flow 100, each open recess within the plurality of open recesses within the IGA matches a form factor 132 of each MPS in the plurality of MPSs. The matching the form factor enables attaching the MPSs to the WSSI. The matching the form factor can further include a buffer or "clearance space." The form factor buffer can accommodate lateral displacement of the plurality of MPSs due to thermal expansion during operation. The IGA contacts the back side 134 of the WSSI between each MPS in the plurality of MPSs. The contacting the back side of the WSSI provides the stiffening of the WSSI. Further, by contacting the back side of the WSSI instead of the front side of the WSSI, heat mitigation techniques can be applied to the front side of the WSSI.

In some example implementations, the MPSs can be attached to the WSSI via a plurality of compression connectors. The compression connectors can enable connections between the WSSI and the MPSs without a solder connection, micro bumps, C4s, and so on. An elastomer sheet, such as an anisotropic conductive film (ACF), can be inserted between the MPSs and the WSSI to provide the electrical connections. The electrical connections can be established through compressing the MPSs, thus compressing the ACF which can form the electrical connections. In addition to helping to maintain planarity and providing a mechanical platform on which to mount a cold plate (described below), the IGA can comprise a compression force plate. The IGA can provide the force needed to establish to electrical connections described. The open recesses formed by the grids of the IGA can include a stiffening ring. The stiffening ring can include an extension over the gridlines which can support the compression force of pushing down on the MPSs.

The flow 100 includes connecting mechanically 150 the plurality of MPSs to a unified control board (UCB). The connecting mechanically can be accomplished using plug-and-socket connectors, terminals, pins, clips, cables, and so on. In a usage example, the connecting mechanically an MPS to a control circuit can be accomplished using a DC power connector and a plurality of rigid-flex strips. The connecting mechanically can be based on a high voltage socket. The UCB can include one or more control circuits. The control circuits can include digital control circuits such as a processor, a multiprocessor, a microcontroller, and so on. The control circuits can control the plurality of MPSs (explained below). In the flow 100, the UCB includes a plurality of DC-to-DC power converters 152. The DC-to-DC power converters can convert DC power from a high voltage range to a low voltage range (e.g., buck conversion). In a usage example, the DC-to-DC converters can convert DC power from a high voltage range, such as 48 volts to 54 volts, to a lower voltage range, such as 12 volts to 13.5 volts. The higher voltage range can be a voltage range normally supplied to racks within a data center.

The flow 100 includes sending DC power 160, by the UCB, to the plurality of functional chips bonded to the front side of the WSSI that was stiffened, wherein the sending is based on the plurality of MPSs and the plurality of TSVs. The sending power can be further based on converting one or more DC voltages. In embodiments, the sending includes delivering the DC power, by the UCB, to the plurality of MPSs, wherein the delivering includes a first voltage conversion. In a usage example, the first voltage conversion can include converting a voltage in a range such as 48 volts to 54 volts to a voltage in a lower range such as 12 volts to 13.5 volts. The first voltage conversion can be controlled by the control circuits included on the UCB.

Further embodiments include transferring the DC power that was delivered, by the plurality of MPSs, to the plurality of functional chips, wherein the transferring includes a second voltage conversion. The second voltage conversion can convert a voltage to a voltage below a threshold. The second voltage conversion can change the voltage that the functional chips receive to an appropriate operating level, such as less than 1 volt. The transferring can be based on a plurality of MPSs that can be bonded to the back side of the WSSI. The second voltage conversion can be controlled by the control circuits included on the UCB. Chips such as the functional chips can be positioned such that connections to the chips align with the TSVs. In some examples, a wafer can be ground to enable TSV processing with repeatable shapes and parasitic characteristics.

The flow 100 further includes mounting the IGA to a cold plate 170. The cold plate contacts the plurality of functional chips bonded to the front side of the WSSI. The cold plate can be used to remove at least a portion of the heat generated by the functional chips while the chips are operating. The mounting the IGA to the cold plate can be accomplished using screws, bolts, clips, fasteners, and so on. In embodiments, the mounting is based on one or more spring-loaded fasteners. Thus, the WSSI can be held between the cold plate and where the WSSI contacts the IGA between the MPSs. The holding can apply pressure on the WSSI from the top and the bottom, stiffening the WSSI and maintaining coplanarity. These can be particularly critical because the WSSI can be thin. The WSSI, especially when ground to accommodate TSVs, can be fragile. The IGA can thus provide support for the WSSI by enhancing stability, increasing stiffness, reducing the chance of cracking, enabling better electrical connections across the WSSI, etc. Thus, in embodiments, the IGA maintains a coplanarity 172 of the WSSI.

In embodiments, the cold plate comprises an inlet plate, a jet-plate, and a fin-plate. The inlet plate can receive a liquid such as a liquid coolant. In embodiments, an inlet nozzle within the inlet plate is located orthogonally to a heat extraction plane within the fin-plate. The jet-plate can create a spray which can be sprayed onto the fin plate based on holes in the jet-plate. The holes in the jet-plate can include holes of substantially similar sizes or different sizes. The holes can concentrate a spray onto a region of the fine plate covering the functional chips. In a usage example, holes toward the center of the jet-plate can be smaller than the holes toward the outer edges of the jet-plate to account for liquid pressure differences across the jet-plate. The fin-plate can include a plurality of internal fins onto which the jet-plate sprays a liquid coolant. The fins can increase the surface area of the fin-plate, thereby enhancing removal of heat from the functional chips to which the fin-plate is attached.

In the flow 100, the cold plate provides liquid cooling 174 for the plurality of functional chips. The liquid can include a coolant where the coolant can be distilled water or another liquid. The coolant can be mixed with additives such as glycol. The attaching the cold plate can include a thermal interface material (TIM). The TIM can conduct heat between surfaces, thus enabling more efficient cooling solutions. The TIM can comprise thermal tape, grease, gel, adhesive, phase change materials (PCMs), metal TIMs, pyrolytic graphite, and so on. In a usage example, the TIM can include an uncured TIM. The uncured TIM can remain flexible or viscous, thereby enabling the cold plate and the functional chips to expand by different lateral displacements based on different coefficients of thermal expansion.

In the flow 100, the attaching further comprises coupling 180 each MPS in the plurality of MPSs to a corresponding functional chip within the plurality of functional chips. The coupling each MPS to a corresponding functional chip can be accomplished using interconnect associated with the WSSI. In embodiments, the coupling can be accomplished using the plurality of through silicon vias (TSVs) associated with the WSSI. In embodiments, the plurality of MPSs is based on a form factor mirroring the corresponding functional chip. Recall that the MPSs can be based on a form factor. In embodiments, each MPS within the plurality of MPSs is based on a form factor mirroring one or more corresponding functional chips, within the plurality of functional chips, on the front side of the WSSI.

Various steps in the flow 100 may be changed in order, repeated, omitted, or the like without departing from the disclosed concepts. Various embodiments of the flow 100 can be included in a computer program product embodied in a non-transitory computer readable medium that includes code executable by one or more processors.

Figure 2:
FIG. 2 is a flow diagram for transferring DC power.
Figure 2:
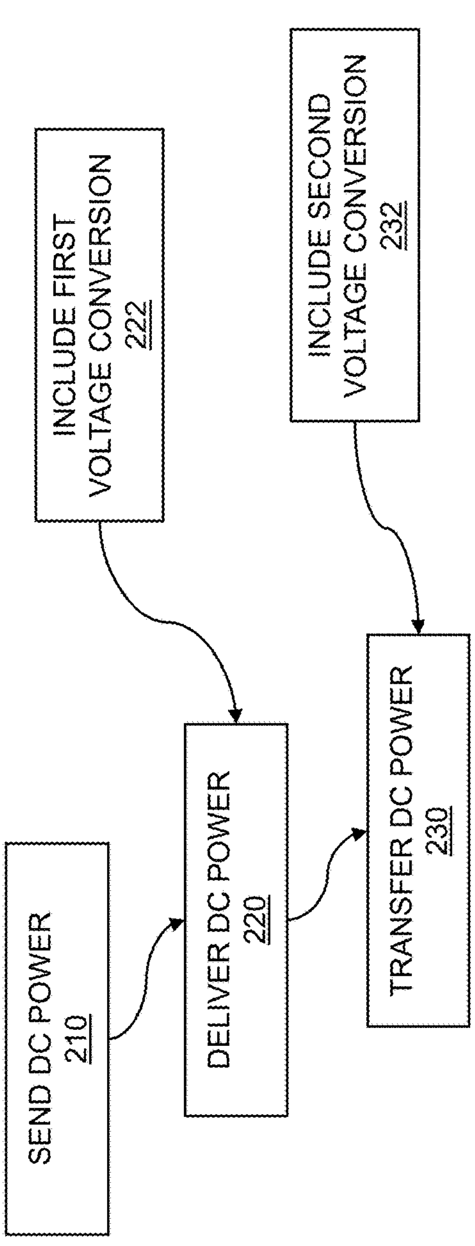

FIG. 2 is a flow diagram for transferring DC power. Chips such as functional chips can be bonded to a wafer-scale silicon interposer (WSSI). The use of the WSSI supports wafer-scale integration (WSI), which is particularly useful to supporting the processing requirements of computationally intensive applications such as artificial intelligence (AI) acceleration. The functional chips that execute the computationally intensive applications require significant amounts of power during operation. The power, which includes DC power, must be sent or transferred to the functional chips. The power can be provided using modular power delivery techniques. A WSSI can be brittle and difficult to handle, especially with a plurality of functional chips bonded to a front side. Further, the coplanarity of the WSSI can vary, resulting in less than optimal electrical connections across the front side and back side of the WSSI. Recall that the WSSI can be ground to enable TSVs. The grinding can thin the wafer, making it more difficult to handle without cracking, especially with the additional weight of front side functional chips. Thus, the wafer-scale silicon interposer must be supported or stiffened in order to protect it from cracking or fracturing. The wafer-scale silicon interposer can be stiffened using an isometric grid array (IGA). The IGA maintains coplanarity of the WSSI. The IGA can also reduce the risk of cracking and fracturing of the WSSI during handling, assembly, functional operation, and so on.

The flow 200 includes sending DC power 210. The power is sent by the unified control board (UCB) to the plurality of functional chips bonded to the front side of the WSSI that was stiffened. The sending DC power can be accomplished using an interposer associated with a wafer-scale silicon interposer (WSSI). The WSSI can include layers of interconnect fabricated on a front side and a back side of the WSSI. The interconnect can include vias such as through-silicon vias (TSVs). The TSVs can provide connections directly between the front side of the WSSI and the back side of the WSSI. In embodiments, the sending is based on the plurality of MPSs and the plurality of TSVs. In the flow 200, the sending includes delivering 220 the DC power, by UCB, to the plurality of MPSs. The delivering can be accomplished using the TSVs, WSSI interconnect, and so on. The delivering DC power can be accomplished by the plurality of DC-to-DC converters included on the UCB. The delivering DC power can include delivering DC power to a subset of MPSs. The delivering DC power can be accomplished by matching one or more DC-to-DC converters to one or more MPSs. Interconnection between the DC-to-DC converters matched with one or more respective MPSs can be accomplished using interconnect associated with the UCB. The sending can be based on a DC voltage.

The DC power that is delivered can include a range for the DC voltage. The range of DC voltage can include a percentage of a target voltage, an allowable operating range of DC voltage, and the like. In a usage example, the voltage range can include 48 volts to 54 volts, inclusive. In the flow 200, the delivering includes a first voltage conversion 222. The first voltage conversion can include a DC-to-DC voltage conversion. The result of the DC-to-DC voltage conversion can include a DC voltage higher than the input DC voltage or a DC voltage lower than the input DC voltage. The first voltage conversion can be accomplished using the one or more DC-to-DC converters. The DC-to-DC converters can include a plurality of DC-to-DC converters connected to the UCB.

The flow 200 further includes transferring the DC power 230 that was delivered, by the plurality of MPSs, to the plurality of functional chips. The one or more functional chips can obtain the transferred power using interconnect, contacts, vias, and so on. The functional chips can also use interconnect and contacts to receive and send data, instructions, control signals, etc. In the flow 200, the transferring includes a second voltage conversion 232. The second voltage conversion can be accomplished using one or more converters such as DC-to-DC converters associated with the MPSs. The second voltage conversion can produce a voltage that can be used directly to operate one or more functional chips. The second voltage conversion can attain a voltage less than the voltage resulting from the first voltage conversion. The second voltage conversion can result in a voltage less than a threshold. The threshold can include a target voltage, an operating voltage, and so on. In a usage example, the threshold is 1 volt. In a usage example, the transferring can be based on the plurality of TSVs. The transferring can include transferring DC power, receiving and sending data, sending and receiving functional chip instructions and control signals, etc.

Various steps in the flow 200 may be changed in order, repeated, omitted, or the like without departing from the disclosed concepts. Various embodiments of the flow 200 can be included in a computer program product embodied in a non-transitory computer readable medium that includes code executable by one or more processors.

Figure 3:
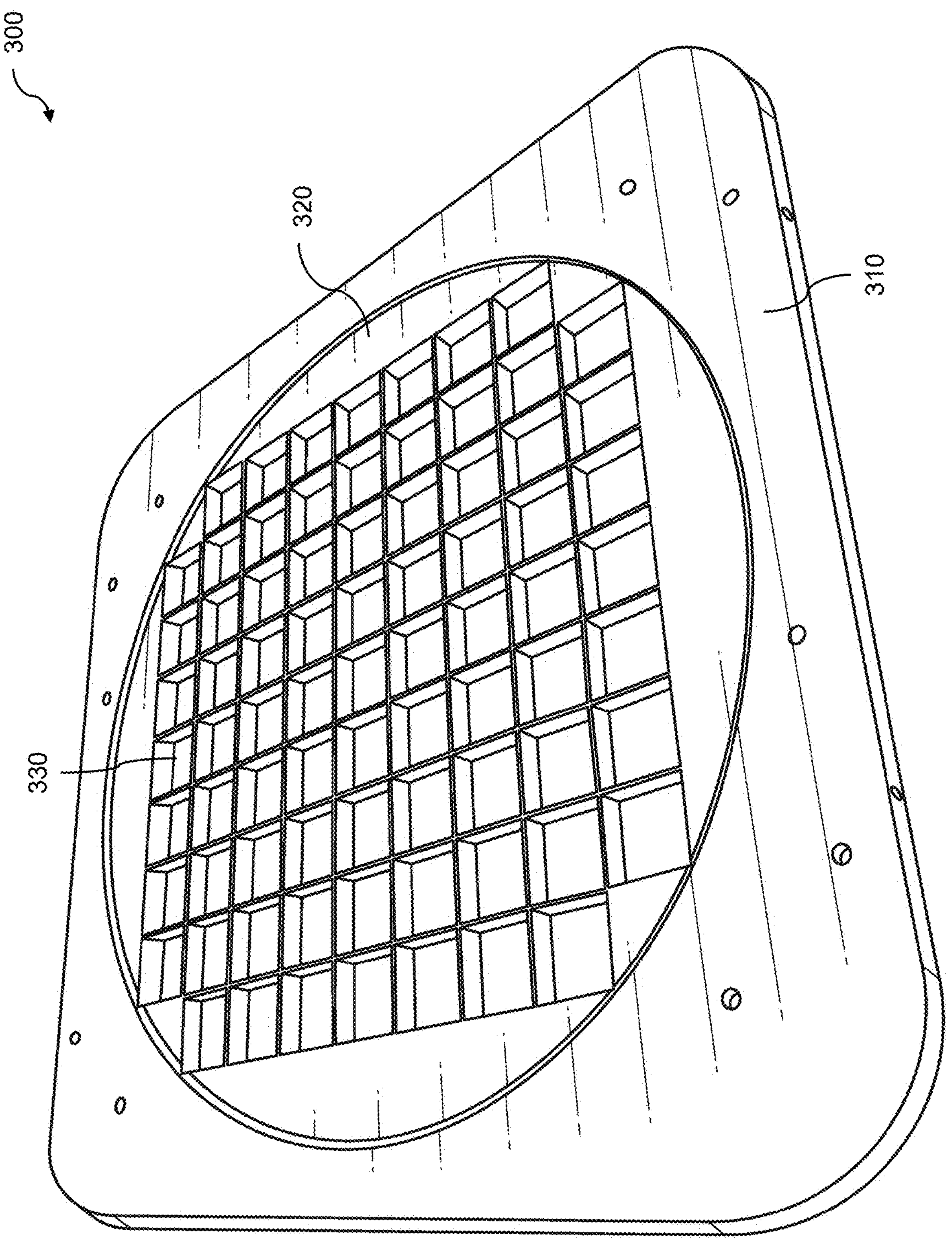
FIG. 3 is a diagram for an isometric grid array.

FIG. 3 is a diagram for an isometric grid array (IGA). The IGA can provide stiffening to a wafer-scale silicon interposer (WSSI). The WSSI can include a plurality of functional chips that can be bonded to a front side of the WSSI. A plurality of modular power substrates (MPSs) can be attached to a back side of the WSSI. The attaching the MPSs to the back side of the WSSI is accomplished through a plurality of open recesses within the IGA. The recesses within the IGA can accommodate lateral displacement of the MPSs due to thermal expansion of the MPSs. The walls of the open recesses within the MPSs can be sufficiently thin to minimize consumption of WSSI real estate by the IGA. The walls of the IGA can further be strong enough to support and stiffen the WSSI, thereby substantially reducing the risk of cracking or breaking the WSSI. The cracking or breaking of the WSSI can result from the thinness to which the WSSI was ground, polished, and so on in order to enhance fabrication of through silicon vias (TSVs) associated with the WSSI. The cracking or breaking can also result from the weight of the functional chips and the MPSs. The TSVs enable communication between the functional chips and the MPSs. The stiffening isometric grid array enables wafer-scale integration.

The figure 300 shows an isometric grid array (IGA) 310. The IGA can include a variety of materials such as various alloys of steel, aluminum, and so on. In a usage example, the IGA can comprise copper. Substantial heat can be generated by the functional chips and other elements while they are operating. At least a portion of the generated heat can be removed by a cold plate such as a copper cold plate. The IGA can include a recess such as a circular recess 320. The recess 320 can include a variety of sizes, where the sizes can correspond to a size of a wafer. The wafer can include a 300 mm wafer, a 200 mm wafer, and the like. The recess can accommodate the WSSI. The IGA can further include open recesses such as open recess 330. The further open recesses can enable attaching a plurality of modular power substrates (MPSs) to the back side of the WSSI. The sizes of the open recesses can be chosen to accommodate the MPSs and a lateral displacement of the MPSs that can result from heating of the MPSs during operation. In embodiments, the IGA comprises a grid. The IGA grid can include square open recesses as shown, or further shapes appropriate to a form factor of the MPSs. The further shapes can include rectangles, circles, ovals, a honeycomb, etc. Recall that the MPSs can be based on a form factor. In embodiments, each MPS within the plurality of MPSs is based on a form factor mirroring one or more corresponding functional chips, within the plurality of functional chips, on the front side of the WSSI. The form factor associated with the MPSs can also be applied to the IGA. In embodiments, each open recess within the plurality of open recesses within the IGA matches a form factor of a corresponding MPS in the plurality of MPSs. Recall that the MPSs are attached to the back side of the WSSI through the plurality of open recesses within the IGA. In embodiments, the IGA contacts the back side of the WSSI between each MPS in the plurality of MPSs. In a usage example, each of the open recesses within the IGA can be "filled" with an MPS attached to the back side of the WSSI. If fewer than a full complement of MPSs has been attached to the back side of the WSSI, than one or more of the open recesses within the IGA can remain open. The IGA can stiffen the WSSI as discussed and can provide other benefits to the WSSI. In embodiments, the IGA maintains a coplanarity of the WSSI. The coplanarity of the WSSI can counteract sagging or warping of the WSSI due to the weight of bonded and attached elements, and any thermal expansion of elements such as functional chips and MPSs that are bonded to or attached to the WSSI.

Figure 4:
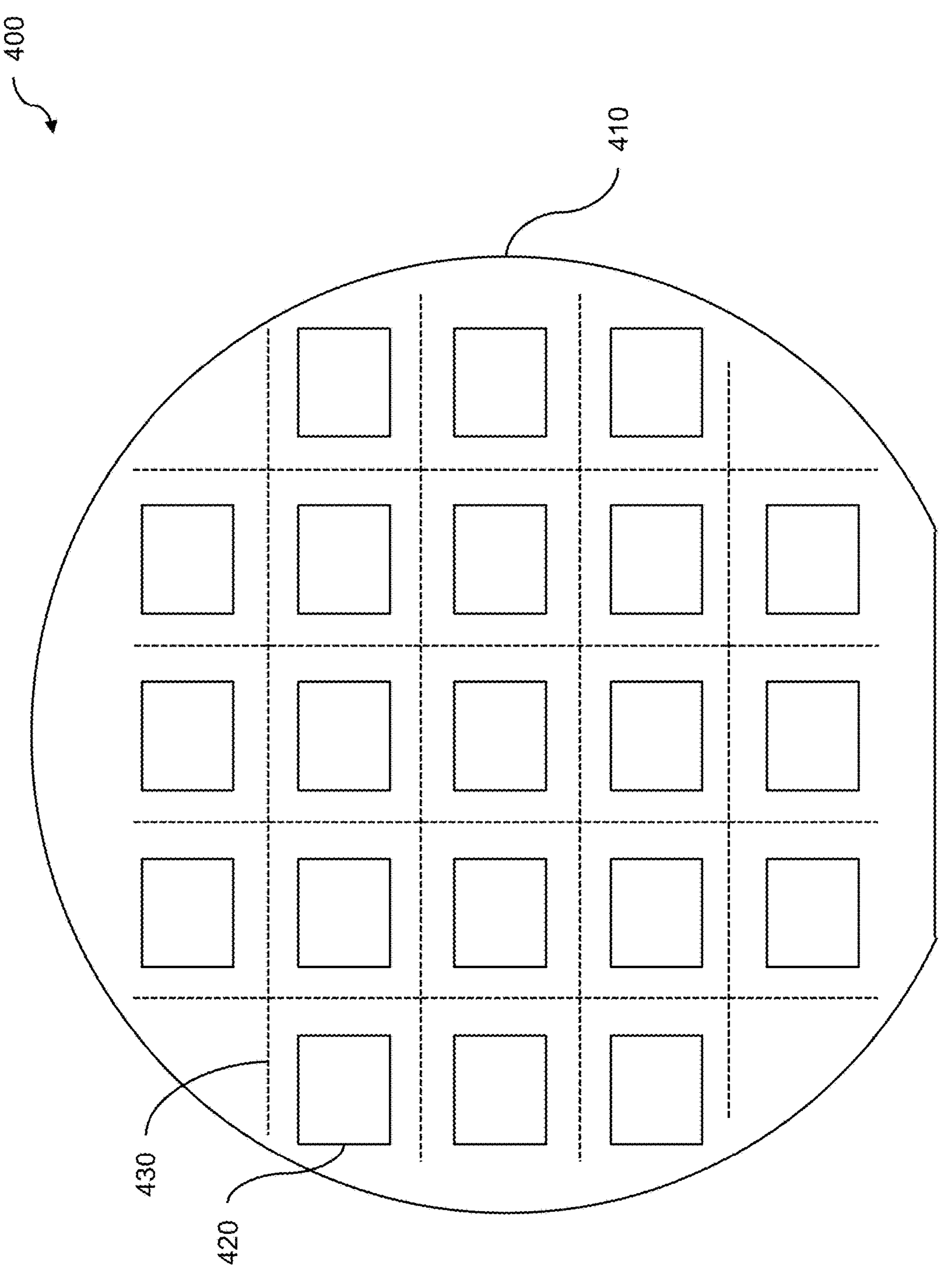
FIG. 4 shows a wafer with multiple die.

FIG. 4 shows a wafer with multiple die. A semiconductor wafer such as a silicon wafer is used in the fabrication of electronic circuits. Other semiconductor materials such as germanium, silicon carbide, indium phosphide, etc. can also be used. The wafers that are used are obtained in various sizes. One common wafer size includes a 300 mm silicon wafer. Integrated circuits or "chips" can be fabricated on the surface of the wafer by applying, removing, etc. various layers. The layers are applied to the wafer using techniques that can include diffusion, deposition, etching, planarization, and so on. The layers can include active areas, polysilicon, metal, contacts, vias, and so on. The circuits are called "die" during fabrication. The die can include a plurality of similar circuits or can include two or more different circuits or "projects". The similar circuits and the different projects can include processors, memories, mixed-signal chips, and so on. The multiple die that can be fabricated on the semiconductor wafer can include accelerators for arterial intelligence and machine learning. The multiple die can be used to enable wafer-scale integration with stiffening isometric grid. An isometric grid can enable stiffening and support of the wafer used for wafer-scale integration.

The figure 400 shows a wafer with multiple die. A wafer can be based on a monocrystalline semiconductor material. The semiconductor material can include a group IV material such as silicon, a group III-V material such as gallium arsenide, and so on. The die on the wafer shown are substantially similar in size. However, the die can be substantially different in size. A system can depend on a certain number of functional die. For instance, an artificial accelerator used for training a large neural network can require a large number of functional die which can be AI accelerators. Since a wafer will contain defects randomly distributed across the wafer, some of the die fabricated on the wafer will be affected by the wafer defects and will not function properly. By fabricating multiples of the die, the probability of fabricating at least one functioning chip increases. Further, because presence or absence of circuits or die on the wafer can influence successful fabrication of a given die, a wafer can be "covered" with circuits for fabrication. Because of the shape of the wafer, which is typically round with at least one flat edge to aid alignment, some of the circuits may not be fully contained within the boundaries of the wafer. The resulting "partial" circuits or die will not function fully or at all. In some cases, the partial die may be usable in other applications.

A wafer is shown 410. The wafer can include multiple die such as die 420. The multiple die can be replicas of the same chip. In some cases, the multiple die can be different die, such as SRAM die. The die on the wafer can all be fabricated using the same fabrication technology. If any die requires different fabrication technologies, then that die must be fabricated on a different wafer. While 21 die are shown on wafer 410, in practice any number of die can be present. The number of die will depend on the size of the wafer and the size of the die. When fabrications steps, of which there can be many, are completed, the die can be separated. The figure shows a plurality of dashed lines such as line 430. The dashed lines represent scribe lines or kerf associated with the wafer. A saw, a laser, etc. is used to slice the wafer into liberated, individual die. Since the saw or other cutting device has a finite width, some wafer material is lost due to the width of the saw or cutting device. As a result, any structures such as test structures used to track processing steps during fabrication are lost.

While multiple die are shown in the diagram, the desire to further push the size of individual die has continued at a rapid pace. As one reference point, a packaged processor chip that is larger than 35 mm on a side has become common. However, as die on a wafer become larger, the risk of individual die being impacted by defects in the wafer or defects associated with any of the many fabrication steps increases. How, then, could one produce even larger chips? One suggestion that has long been proposed is to use the "entire" wafer to form a single large chip or "super chip". In addition to producing the one chip on the wafer, packaging could potentially be reduced since the packaging would involve the one chip instead of a typical suite of chips, where each chip requires its own packaging. Wafer scale integration or WSI has been proposed as particularly well suited to applications that demand extensive data processing. Examples proposed that could benefit from WSI have included computer architectures appropriate for massively parallel supercomputers, and computationally intensive applications such as machine learning and deep learning. However, successful fabrication of a single chip across an entire wafer is an extremely difficult undertaking. Noted above, the widespread and random distribution of defects and other variations such as warpage across a wafer render the ability to build one "super-circuit" elusive. Also, circuit redundancy becomes a major design issue. Not only are redundant circuits that can be switched in to replace defective circuits necessary, but the locations of the redundant circuits are also critical. Note that the redundant circuits must be connected in place of the defective circuits, and that wiring on an integrated circuit is extremely expensive in terms of real estate. As a result, the placement of the redundant circuits must be carefully considered to conserve wafer real estate and to reduce wiring complexity.

Figure 5:
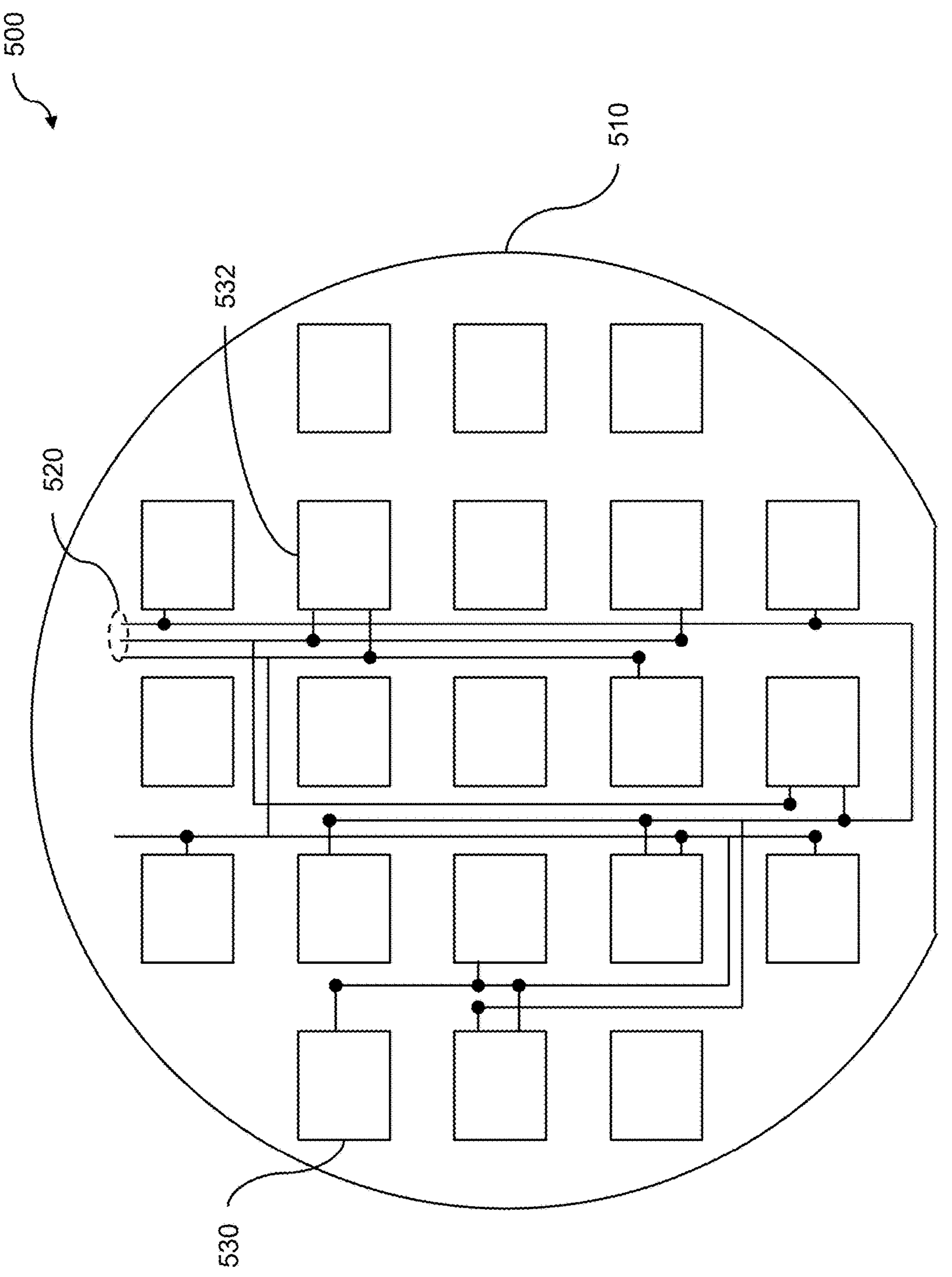
FIG. 5 illustrates inter-die interconnect for wafer-scale integration.

FIG. 5 illustrates inter-die interconnect for wafer-scale integration. Discussed previously and throughout, the demand for ever larger integrated circuits that can meet increasingly intensive processing demands has been stymied by the difficulty of producing large, single chips. One of the fundamental difficulties of producing a large chip, such as a wafer-sized chip, is that defects are randomly distributed across a wafer on which the large chip would be produced. Further, defects, such as disconnects in wiring, variations in oxide (insulator) thicknesses, open-circuit contacts, varying doping profiles, and so on, can be introduced during the fabrication process. One possible approach to "wafer-scale" integration is to continue to fabricate circuits on the wafer. Then, instead of cutting the wafer to access the individual dies, the wafer remains whole. By adopting an approach such as this one, the kerf, previously lost to the cutting of the wafer into the individual die, can be used for interconnect. Recall that interconnect on a wafer consumes wafer real estate that cannot be used for circuitry. By capturing the real estate previously lost to the kerf, additional wafer real estate that can be used for interconnect is captured. The interconnect in the kerf is particularly appropriate for long-haul connections, such as connections between individual die on the wafer. Since the wafer can be thinned during fabrication to enable vias, called through-silicon vias, to provide connections between a front side of the wafer and a back side of the wafer, the wafer can be reinforced. Wafer-scale integration with a stiffening isometric grid array enables the inter-die interconnection.

The figure 500 illustrates use of wafer real estate, otherwise lost to scribe lines or kerf for inter-die interconnect, for wafer-scale integration. A wafer 510 is shown on which multiple die, or chips, are distributed. The die are fabricated together on the wafer. That is, each of the die on the wafer is fabricated based on the same processing steps. Since the individual die will not be separated from the wafer using a cutting technique, the kerf area of the wafer can be used for interconnect. Other areas of the die can also be used for interconnect. The interconnect 520 can be placed in wiring channels or routes, where the wiring channels are realized in what would formerly have been the kerf. The wiring channels include wafer real estate in which interconnecting wire can be placed. The interconnect can be fabricated while the various die on the wafer are fabricated. The interconnect can include a plurality of wiring layers. The various layers can be interconnected using contacts, vias, and so on. In the figure, a few example interconnecting runs are shown. The various die on the wafer can make connections to the wiring channels. In the figure, die 530 can use the wiring channels to connect to die 532.

Figure 6:
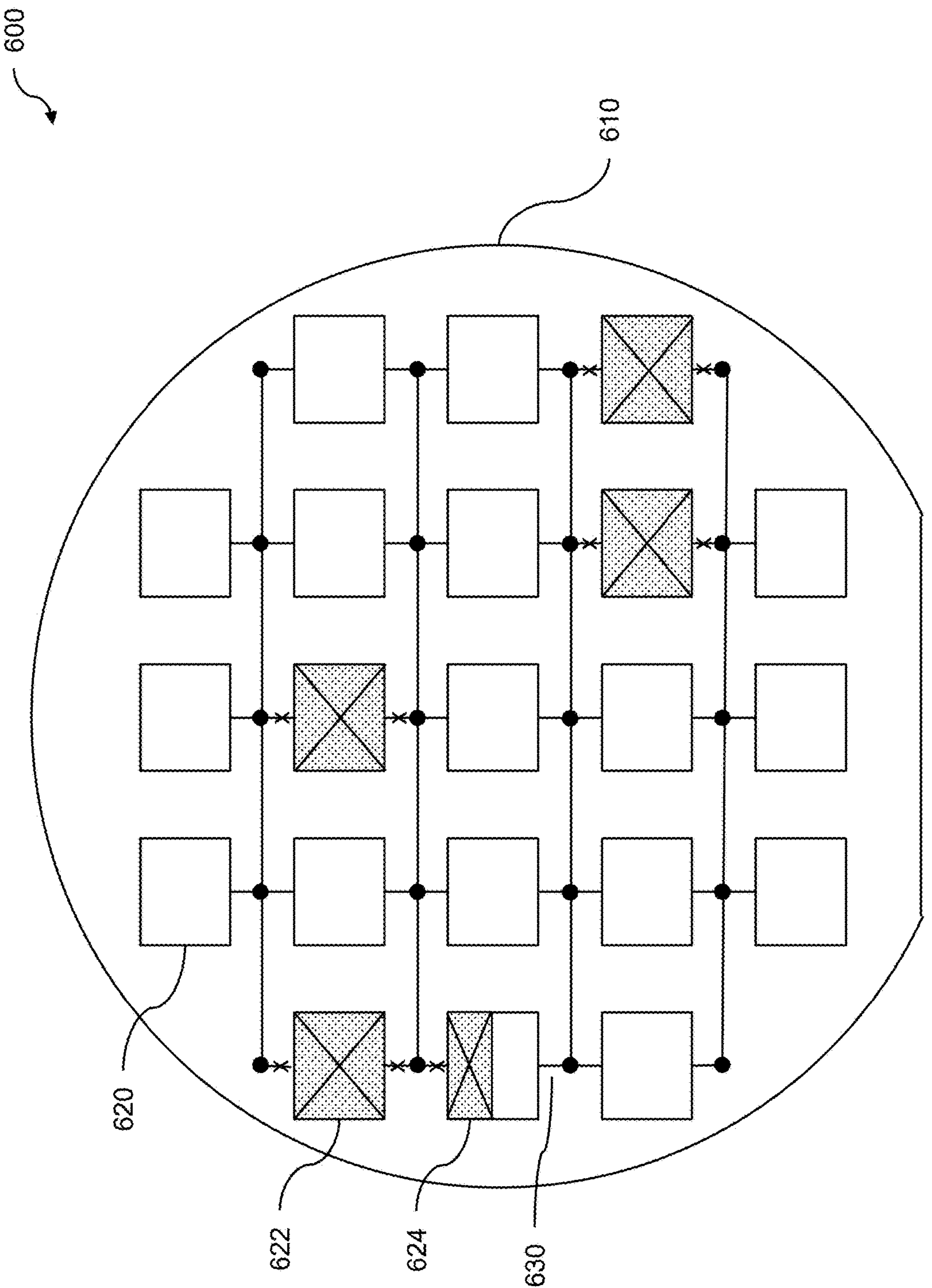
FIG. 6 shows inter-die interconnect and redundancy for wafer-scale integration.

FIG. 6 shows inter-die interconnect and redundancy for wafer-scale integration. Building on the previous discussions of techniques including fabricating redundant die on a wafer and of using the kerf for interconnect, a technique for wafer-scale integration (WSI) can be based on fabricating redundant die on the wafer and selecting the working die for use by a system based on WSI. Working die can be selected while non-working die, partial die, and other substandard die can be electrically ejected from the system by deselecting them. The deselecting can include disabling wired connections to the unused die, physically "blowing" connections to the unused die, and so on. The remaining functioning die can be interconnected using inter-die interconnect to form a system on the wafer. The system on the wafer can achieve the desired objective of wafer-scale integration. Power, data, control signals, and so on can be provided to the selected, working die. Due to the size of the wafer on which the interconnected die are fabricated, the wafer can be subject to warping, breakage, and so on. The wafer can be supported such that risks of damage to the wafer and the die on the wafer can be minimized. Inter-die interconnect and redundancy for wafer-scale integration are enabled with a stiffening isometric grid array.

The figure 600 shows redundant die and inter-die interconnect. A wafer is shown 610. The wafer is populated with multiple die 620. A number of the die shown can be redundant. Some of the redundant die will include defects, can miss specifications, or can otherwise fail. The defects can be associated with the wafer on which the die are fabricated, associated with one or more processing steps for fabricating the die, and so on. This can result in die that are not operational, such as die 622. Recall that die can be fabricated on the wafer in order to ease some fabrication complexities, and that some of the added die can include partial die such as die 624. The failed die and the partial die can be excluded from a system formed by wafer-scale integration (WSI). In some cases, a die such as 624 can be partially functioning. The portion of the die that is functioning can be included in the WSI, while the portion of the die that is not functioning can be excluded. The functioning die can be inter-connected using inter-die interconnect 630. The inter-die interconnect can include multi-layer interconnect. The inter-die interconnect can be placed between the die associated with the multiple projects. Functioning die can be connected to the inter-die interconnect, while non-functioning die can be disconnected from the inter-die inter-connect.

Figure 7:
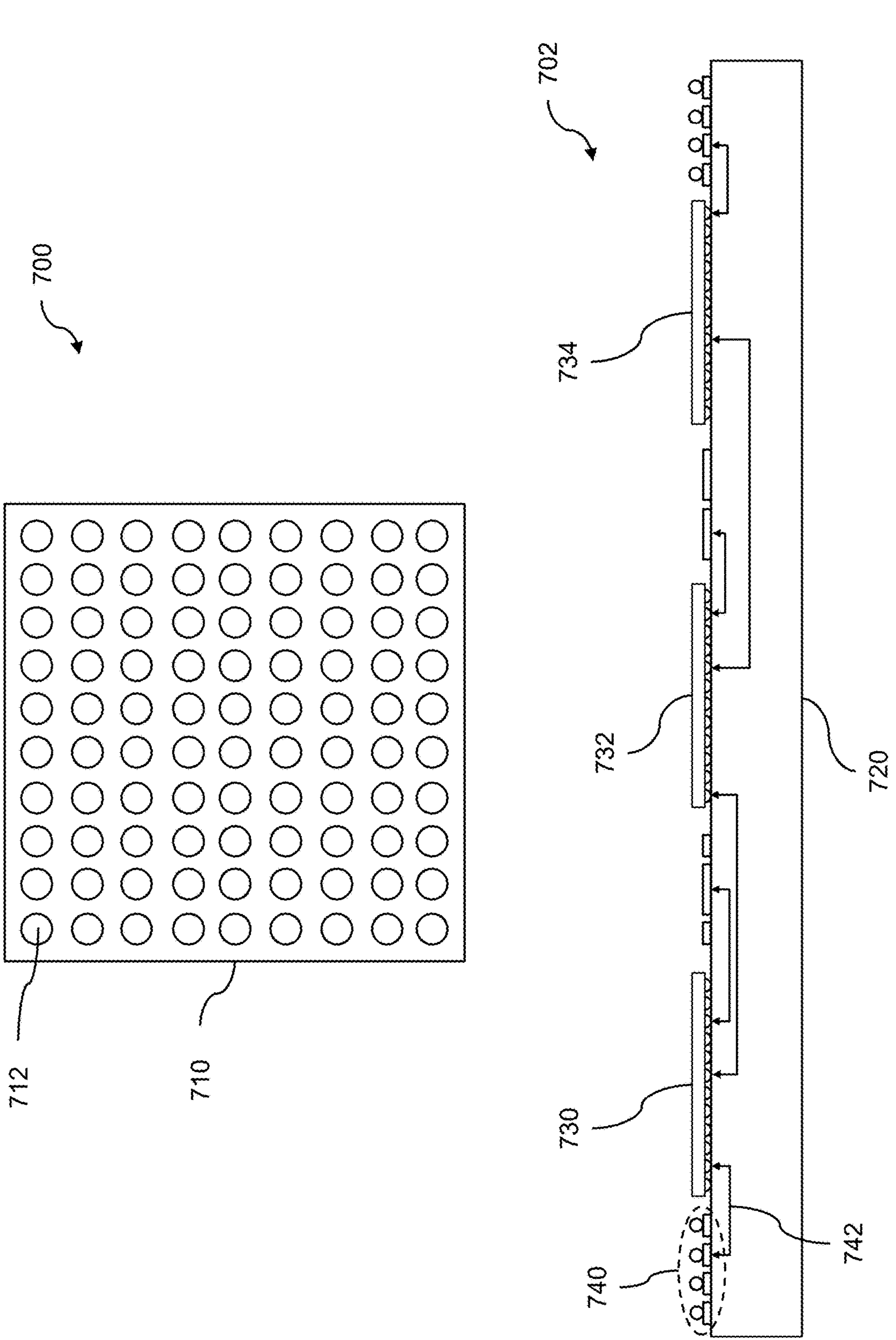
FIG. 7 illustrates a flip chip and interposer with flip chips for wafer-scale integration.

FIG. 7 illustrates a flip chip and interposer with flip chips for wafer-scale integration. One technique that can be used to approach the benefits of wafer-scale integration is to attach more than one chip to a common substrate or interposer. The substrate can include a wafer, a carrier, a circuit board, and so on. To accomplish such a technique, all interconnections to a circuit or chip, including data connections, control and signal connections, power connections, and so on, can be made at the top layer of the chip. The connections at the top of the chip replace the traditional placement of pads at the periphery of the chip. To connect the top connections of the chip to the interposer, solder balls are placed on the top connections and the chip is inverted or "flipped". The solder balls, when melted, can connect the top connections of the chip to corresponding connections or pads on the interposer. Further chips can be similarly flipped and connected to additional corresponding connections on the interposer. One challenge to the flip-chip technique is that the aggregate weight of the flipped chips can be sufficient to pose a risk to the delicate wafer or interposer. The wafer can be stiffened in order to protect it from the weight of the flipped chips. The flip-chip technique enables wafer-scale integration with a stiffening isometric grid array.

The figure 700 includes an example flip-chip. Discussed previously, the flip-chip 710 differs from a traditional chip in that the connections to the flip-chip are made at the top of the chip rather than to pads located at the periphery of the chip. The top of a flip-chip is shown. The top can include pads that can be connected to pads corresponding to pads on a multi-chip module, a circuit board, an interposer, and so on. An example contact or pad 712 is shown. Multiple pads can be distributed across the top of the flip-chip. The pads can be oriented to correspond with receiving pads on the interposer. An array of pads is shown. In a usage example, a subset of pads is required to connect the flip-chip to the interposer. Thus, required pads are present at the top of the flip-chip, while the unused pads can be omitted from the top of the flip-chip.

The figure 702 illustrates an example interposer. As discussed previously, the interposer 720 can include a wafer, a carrier, a circuit board, and so on. One or more flip-chips can be attached to the interposer. In the figure, the flip-chips can include a first flip-chip 730, a second flip-chip 732, a third flip-chip 734, and so on. While three flip-chips are shown, other numbers of flip-chips can be attached to the interposer. In a usage example, the flip-chips can be attached to the interposer in a grid pattern. In addition to serving as a landing spot for the flip-chips, the interposer can provide interconnect. The interconnect can be used to provide signals such as control signals, data, and so on to the flip-chips. The interconnect can further provide power to the flip-chips. Depending on the interposer used to receive the flip-chips, the interposer can include one or more layers of interconnect. The interconnect can include interconnect at a top surface of the interposer such as top surface interconnect 740. The interposer can further include additional layers of interconnect. The additional layers of interconnect can be fabricated on the interposer. The additional layers of interconnect can be isolated from each other using an insulating layer between the conducting interconnect layers. An example "lower layer" connection 742 is shown.

The use of flip-chips attached to an interposer can enable multichip module (MCM) techniques. A multichip module can refer to a substrate, carrier, circuit board, interposer, etc. onto which multiple ICs can be placed. The multiple ICs can be attached to the interposer, and the multiple ICs can be wired together using interconnect provided by the interposer. The interconnect associated with the interposer can provide power, control signals, and data between and among the ICs that are attached to the interposer. The power can be provided using modular power techniques. Depending on the particular type of MCM, the interposer can further include discrete components such as discrete resistors, discrete capacitors, discrete inductors, etc. The interposer further includes wiring for interconnecting ICs and the discrete components, if any. The MCM can be packaged and used as if it were a single IC on a board such as a circuit board within a system. MCMs have also been referenced as heterogeneous integration circuits and hybrid integrated circuits. A principal advantage of using MCMs is that multiple electronic components can be enclosed in a single "chip", thereby improving modularity of a system design. Also, the use of MCMs can improve IC yields over ICs produced using monolithic IC design methodologies.

There can be several varieties of MCMs, where the MCM varieties are typically differentiated by size, complexity, design methodologies, and so on. At one end of the complexity scale, an MCM can include standard off-the-shelf ICs. The ICs can be attached to a circuit board such as a printed circuit board and can be used in place of an existing chip or package of chips. The printed circuit board can be designed to match the size pin-out of the existing chip or package of chips. An MCM can also be a complex element. The complex MCM can be based on one or more fully customized IC packages. The fully customized IC packages can be used to integrate multiple IC dies (e.g., unpackaged ICs) onto a substrate that provides interconnection among the dies. Because of the wiring requirements of the multiple IC dies, the substrate typically includes high density interconnection (HDI). The substrates that are used for the MCM can include thin films for interconnects (wires) and dielectrics (insulators); thick films that enable more than one layer of interconnect, and ceramic; and substrates that include laminates based on organics or plastics. The MCM based on thin films of interconnects and dielectrics can result in the highest circuit densities.

The MCM design concepts described previously suggest promising leads for implementing wafer-scale integration ICs. Multiple circuit dies could be fabricated within the same wafer. The wafer could further include built-in self-test (BIST), circuit redundancy to provide spare parts, and "self-rerouting" which can reroute around defective or failed elements and can wire in known good spare parts. In order to enable such capabilities, a significant number of interconnection layers would be required for WSI. Interconnect layer counts of approximately ten layers have been predicted. In order to implement WSI in a cost-effective manner, several techniques have been proposed, such as using an artificial neural network to develop a programmable topology, using a multichip-scale package, and so on.

Another technique that is being developed to enable wafer scale integration is based on the use of a silicon interposer, as discussed above. The silicon interposer, which can be a wafer, can be used to provide interconnections among a wide variety of components. The components include integrated circuits (chips), chiplets, power supplies, power converters, discrete electrical components, and so on. The interposer provides connection points that can be used to mechanically and electrically mount the chips, chiplets, etc. The interposer can be formed from inorganic materials such as glass or silicon, or organic materials such as those used to manufacture printed circuit boards. The electrical connections can be set to a pitch to simplify the attaching of the electrical elements. The electrical connections can be based on standardized manufacturing techniques such as using solder balls, micro-bumps, controlled collapse chip connection (C4) bumps, and/or electroplated bumps. The bumps on a chip are produced on the "top" side of a wafer (e.g., the non-substrate side) as a final processing step for the wafer. To mount the chips to the interposer, the chips are "flipped" using a flip-chip technique. The bumps at the top of the chips connect to pads on the interposer. The interposer can enable connections from the flip-chip to a standard connection arrangement such as a grid. The interposer can further provide one or more layers of interconnect according to the process used to manufacture the wafer. Thus, higher densities, higher bandwidth, and faster speeds can be achieved. The layers of interconnect are used to provide power and ground, control signals and data, and so on.

Figure 8:
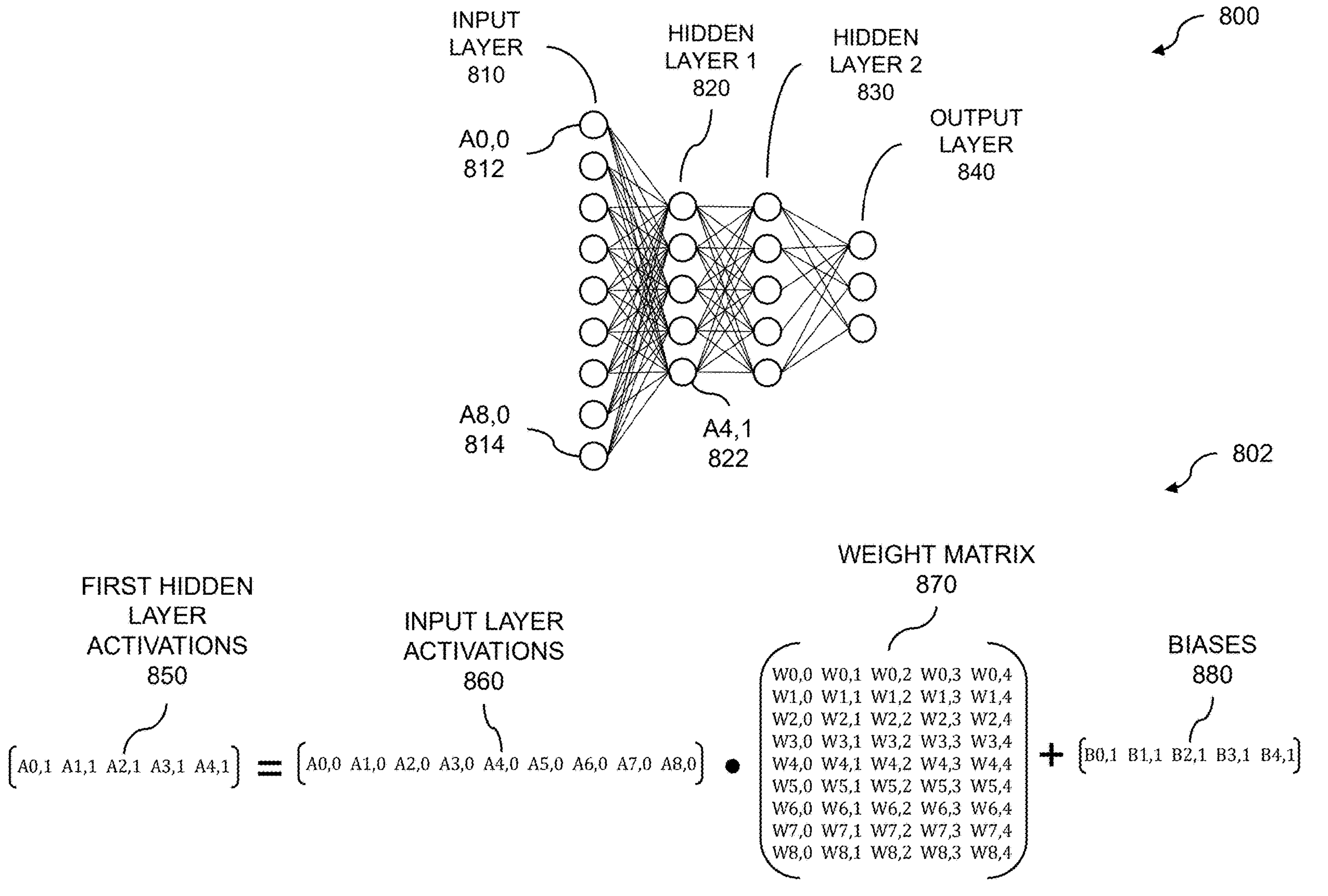
FIG. 8 is an illustration of a neural network.

FIG. 8 is an illustration of a neural network. The neural network (NN) can include a convolutional neural network (CNN). A convolutional neural network can be a type of deep learning system that can learn or be "trained" using data such as training data provided to the system. The training data can be provided along with "known good" or expected inferences and results. CNNs can be extensively used for image and video recognition, image classification, image segmentation, natural language processing (NLP), and so on. A CNN can use a few (such as tens), or many (such as hundreds, thousands, etc.) of layers of processing units called neurons. The neurons can accomplish calculations which can determine a weighted sum of inputs from inputs to the CNN or layers of previous neurons. The neurons can include a bias which can determine or alter the impact of a neuron on a future neuron (e.g., a neuron in a subsequent layer of the CNN). The neuron can include an activation function such as a sigmoid function, a rectified linear unit (ReLU) normalization function, a hyperbolic tangent (tanh) function, and so on. The activation function is used to ensure that the value calculated by the neuron remains between 0 and 1. The value stored in the neuron can be called an "activation". The neuron can process any type of data including any floating point format such as single precision floating-point, double precision floating-point, brain floating-point 16 (BF16), BF8, and so on. The neurons can be arranged into layers. The output of a neuron in one layer can be used to feed one or more neurons in another layer. One or more layers can comprise fully connected layers where a neuron in a first layer is connected to each neuron in a previous layer. The various layers and connections between layers can form the basis of an inference operation by the neural network. The neural network can be enabled by wafer-scale integration with a stiffening isometric grid array.

The illustration 800 shows an example CNN comprising groups of neurons arranged by layers within a network architecture. The input data for a neuron can come from an original data source, such as a video image, or from a previous input layer of neurons. The output value from each neuron can be used to feed one or more neurons in another layer of neurons or can be part of a final output layer. In the illustration 800, the first layer at the left of the figure can be called the input layer 810. Each neuron or processing unit in this layer can receive data directly from a source such as a still camera, video camera, passive infrared (PIR) camera, and so on. Neurons can be numbered for identification. For example, 812 shows a neuron which contains an activation for the first layer at a first neuron. Thus, this neuron can be labeled A0,0. In a similar manner, 814 shows neuron A8,0, which can refer to the ninth neuron in layer 0. This can indicate that there are 9 neurons/activations in the first layer (e.g., "layer 0") of the neural network. In practice, any layer can contain any number of neurons. The number of neurons in a given layer can be heuristically determined. Large CNNs can have thousands or millions of neurons at the input layer.

The numeric values calculated by each neuron (called activations) in the input layer can become the input for the next layer of neurons. The next layer of neurons can be a hidden layer. Any number of hidden layers can be included in the neural network. In the illustration 800, the first hidden layer is hidden layer 1 820 and includes five neurons. A second hidden layer 830 is included which also has five neurons. A final layer, an output layer 840, is shown which includes three neurons. The output layer can comprise the final inference from the neural network. For example, if the neural network depicted in 800 comprises a system for determining whether a traffic light was red, yellow, or green, the top activation function/neuron in the output layer could be for red, the middle could represent yellow, and the bottom green. The final value found in each activation within the output layer can comprise a probability. For example, the final output layer could comprise values (from top to bottom) such as 0.01, 0.2, and 0.99. The strength of the network prediction can grow the closer the output value is to 1. Thus, the neural network in this case can indicate a high probability that the light is green.

In practice any number of neurons can be included in any number of hidden layers. A hidden layer within the CNN can include a truncation layer, a bottleneck layer, and so on. The illustration 800 shows that every calculated value from the input layer is connected to every neuron in the first hidden layer. The first hidden layer is described as a fully connected layer. Each connection can be associated with a weight and a bias. Weights and biases can determine how much the value in the current neuron should affect other neurons in the next layer. Thus, the connection between A0,0 812 and A4,1 822 can include a first weight, while the connection between A8,0 814 and A4,1 can include a different weight. A unique bias can be associated with A4,1. The weights can be labeled to make it clear which nodes are coupled between a previous layer and a current layer. For example, for the first hidden layer, W0,0 can couple neuron 0 from the input (previous) layer to neuron 0 in hidden layer 1 (the current layer).

In a similar way, the value for each neuron in the first hidden layer can be determined by a large matrix multiply function as shown in illustration 802. Each activation function in the first hidden layer can be represented by a 1-dimensional vector such as shown at 850. The activations from the input layer can be shown in another 1-dimensional matrix such as 860. A 9×5 matrix can be created which includes all weights between the first input layer and the first hidden layer as shown at 870. In practice, the weights can comprise any number of rows and columns according to the size (e.g., number of neurons) of the layers. Finally, the biases associated with each connection from the input layer to the first hidden layer can be represented in a 1-dimensional matrix such as 880. For example, in the illustration 800, the value of A4,1 822 can be the sum of all the weighted (W) inputs from the previous layer, with a final bias added as shown in the following equation: A4,1=[(A0,0*W0,4)+(A1,0*W1,4)+ . . . +(A8,0*W8,4)+B4,1]. As stated previously, the activation A4,1 can include a non-linear transformation such as a sigmoid, ReLU, Tanh, and Softmax. The non-linear transformation function can ensure that the value of the activation remains between 0 and 1 and does not "saturate" with a value or 1 or a value of 0.

Each transition to a different layer within the neural network can require a different matrix multiplication function. Thus, a neural network with many layers can heavily tax a processor core. As the number of neurons/activations within the layers grows, the matrix multiplication function grows increasingly complex. For example, the total number of weights and biases in a neural network can be called the number of parameters in the system. In the case of illustration 800, relatively few parameters have been included. In the first layer, each of the nine neurons is connected to five neurons, with each connection including a weight. A separate bias can be included for each of the five neurons. Thus, in an example configuration, the first layer can include 9×5+5=50 parameters. The second layer includes five neurons connected to another five neurons at the next layer, each connection including a weight. Again, a bias can be included for each neuron. Thus, the parameter count for the second layer as shown is 5×5+5=30. The third layer comprises five neurons with each neuron connected to three neurons in the output layer, where each connection also includes a weight. A bias can be included for each of the three neurons. Thus, the number of parameters is 5×3+3=18. Thus, the number of total parameters in the system can be 50+30+18=98.

Consider a large neural network used for modern large language models. As these networks can comprise billions or trillions of parameters, the matrix multiply function can be exceedingly large. To lessen processing bottlenecks, the matrix multiply functions required, which can include matrices with hundreds, thousands, or even millions of rows and columns, can be separated based on submatrices and distributed across many special purpose processors. This technique can decrease the processing time required to perform each matrix multiply. However, this approach can drive bandwidth requirements between many processors and many memory chips as the single large matrix multiply can be split, sent to many processors for execution, collected at a central processor, and then the result must be combined. In large neural networks, this can occur for every inference, driving large memory bandwidth requirements. For example, if 1 billion parameters are used in a neural network, each saved in a single precision floating point format (32-bits), the resulting model could require tens of megabytes (MB) of memory simply to store the parameters of the network. A neural network with 1 trillion parameters could require tens of gigabytes (GB) of memory. As discussed below, training the neural network can drive the need for additional bandwidth as each processor must keep a copy of the previous activations, weights, and biases that are required to perform a matrix multiply. In addition, the training data, which can also be quite large, must be sent. In sum, while neural networks have driven processor improvements, especially in matrix multiply efficiency, the bandwidth needed to keep each processor occupied in a large neural network remains a significant challenge. This can be especially true for some neural networks such as transformers. In these cases, bandwidth requirements of running inferences can place a larger demand on the system than even training (as described below).

Figure 9:
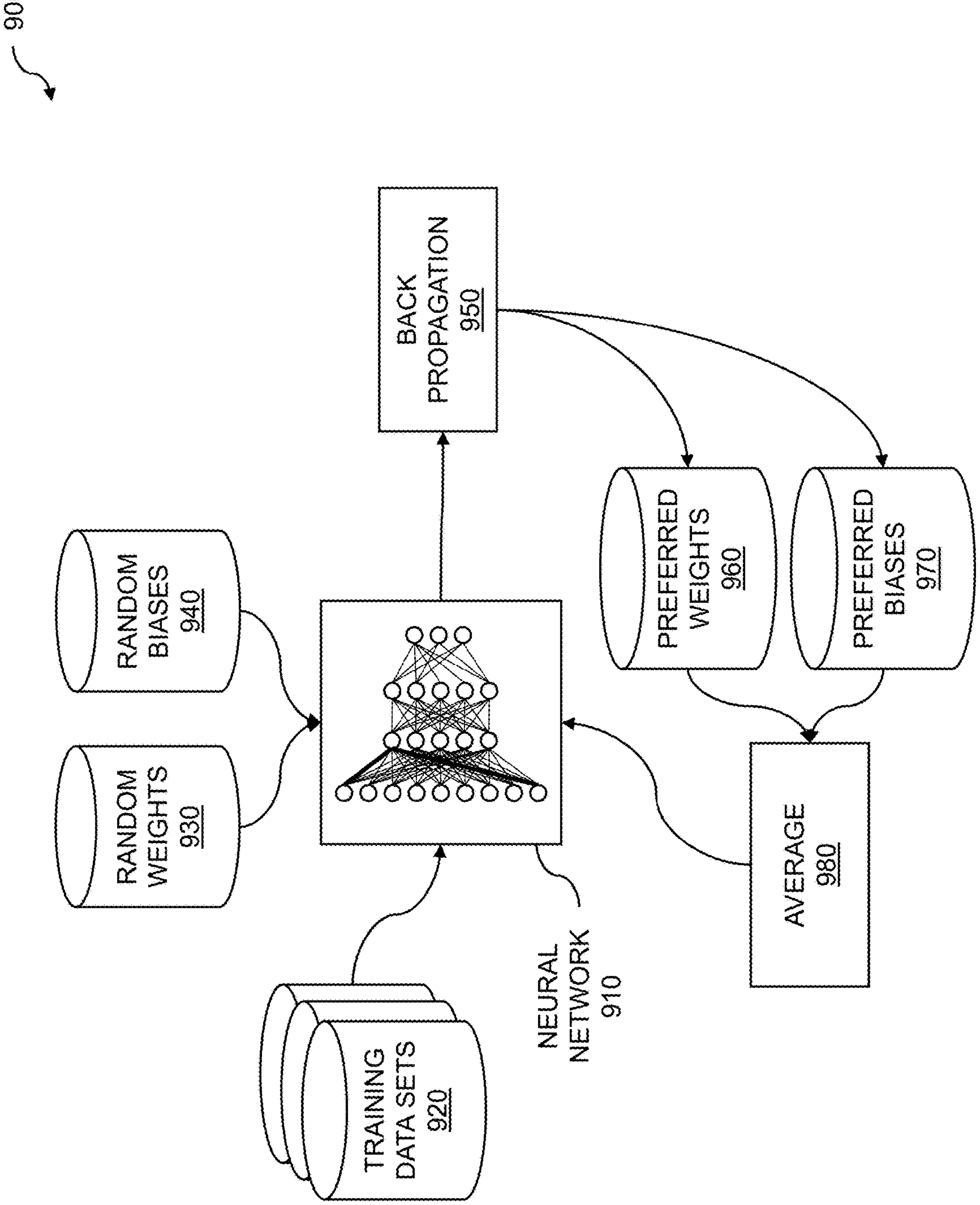
FIG. 9 is an example of training a neural network.

FIG. 9 is an example of training a neural network. A neural network can be trained to accomplish a task. The task can include identification of objects within an image, facial recognition or speech recognition, data classification, and so on. A neural network, as previously described in illustration 800 above, is shown in example 900 at 910. The neural network can comprise any number of neurons/activations. The neurons/activations can be organized in layers. Training datasets 920 can be provided to the neural network to train the neural network. The training datasets can be based on the type of inference required from the neural network. The inference can be based on a classifier. For example, if it is desired for the network to identify a type of animal, then the training set can include many different types of animals in many different settings and environments. In practice, a large amount of data is required to train a network to properly perform an inference. For example, in video processing/recognition, a rule of thumb can be ten training images per parameter. Thus, a small neural network with 1,000 parameters could have 10,000 images or more for training. If these images are large, the memory requirement to store them can also be large. For example, 10,000 8-bit greyscale images in a resolution of 720×720 pixels could require: (8-bits/pixel)×(518,400 pixels)×(10,000 images) =40.5 GB. The memory requirement would be higher for color images such as RGB images or for higher resolution images. To train a neural network, each of these images can be sent to the input layer of the neural network for training, requiring wide and fast memory connections to the processors performing the training. The training can include training a neural network configured on processors within wafer-scale integration. The training the neural network is supported by wafer-scale integration with a stiffening isometric grid array.

The neural network can begin with a random set of weights 930 and biases 940. In some embodiments, a previous set of weights and biases may be used or may have been obtained prior to training and used in place of purely random values. The training process can alter those weights and biases such that an accurate inference can be performed with inputs that the neural network has not previously seen. To train the network, a first image from the first training dataset can be sent to an input layer, as described in the previous figure. Each layer of the neural network can then calculate values based on a weighted sum of each connected neuron in the previous layer. This calculation continues until all neurons in all layers have generated an input. The final values can be captured at the output layer of the neural network. The training can comprise a supervised training. In supervised training, a desired output for each neuron in the output layer can be pre-determined along with each training image. The pre-determined desired output can be a label. A cost function can be created for each training image, which can be obtained by adding the squares of the differences between the result of each neuron in the output layer and the desired result (which can be found in the label of the training data) of that neuron.

Training can reduce the cost function associated with every training image by determining a gradient of the cost function for each image. This can be computed by back-propagation 950. The back-propagation process can determine, for each neuron in the network, what changes should be made to its associated weight and bias to reduce the cost function most effectively. Since a neuron in a layer N is affected by the previous layer N−1, the neurons in N−1 must also be adjusted. Thus, back-propagation can be an iterative algorithm starting from an output layer of the neural network and ending at the input layer. To train the neural network, each image can be processed forward through the neural network and then back-propagated through the network to determine changes necessary for a more accurate inference in the future. This process can be repeated for each image in the training set. Because of the large amount of data required to keep all images in memory, the training data can be randomly divided into datasets which can also be "mini batches." Training the network can take place on one mini batch at a time to lower bandwidth and compute requirements. For example, the neural network can perform forward processing and back-propagation on the first training image within the first mini batch, resulting in a first set of preferred weights 960 and biases 970. The preferred weights and biases can reflect a desired value for the weight and bias at every neuron to more accurately predict an output based on the first training image within the first mini batch. The neural network can then perform the same function on a second image, resulting in a second set of preferred weights and biases. This process can be repeated for each image in the mini batch. Once each image is processed, and an associated set of preferred weights and biases is computed, each preferred weight and bias for each node can be averaged 980 to determine the final adjustment that will be made to the actual weights and biases in the network due to the mini batch of images. Once the neural network is updated, another mini batch of training images can be used to further train the network in the same way.

Consider a large neural network with billions of parameters and large matrices that must be calculated to determine each activation. Also consider the large amount of training image data that must be sent to the network and the amount of data that must be maintained during training (including the intermediate weights and biases for each node resulting from each training pass of each image in a mini batch prior to averaging). Finally, consider that a large neural network can be distributed across many functional processors, all with a need to access a relevant portion of the data described above. The bandwidth requirements for training such a neural network are extremely high. New methods and technologies can be required to feed such a distributed network.

Figure 10:
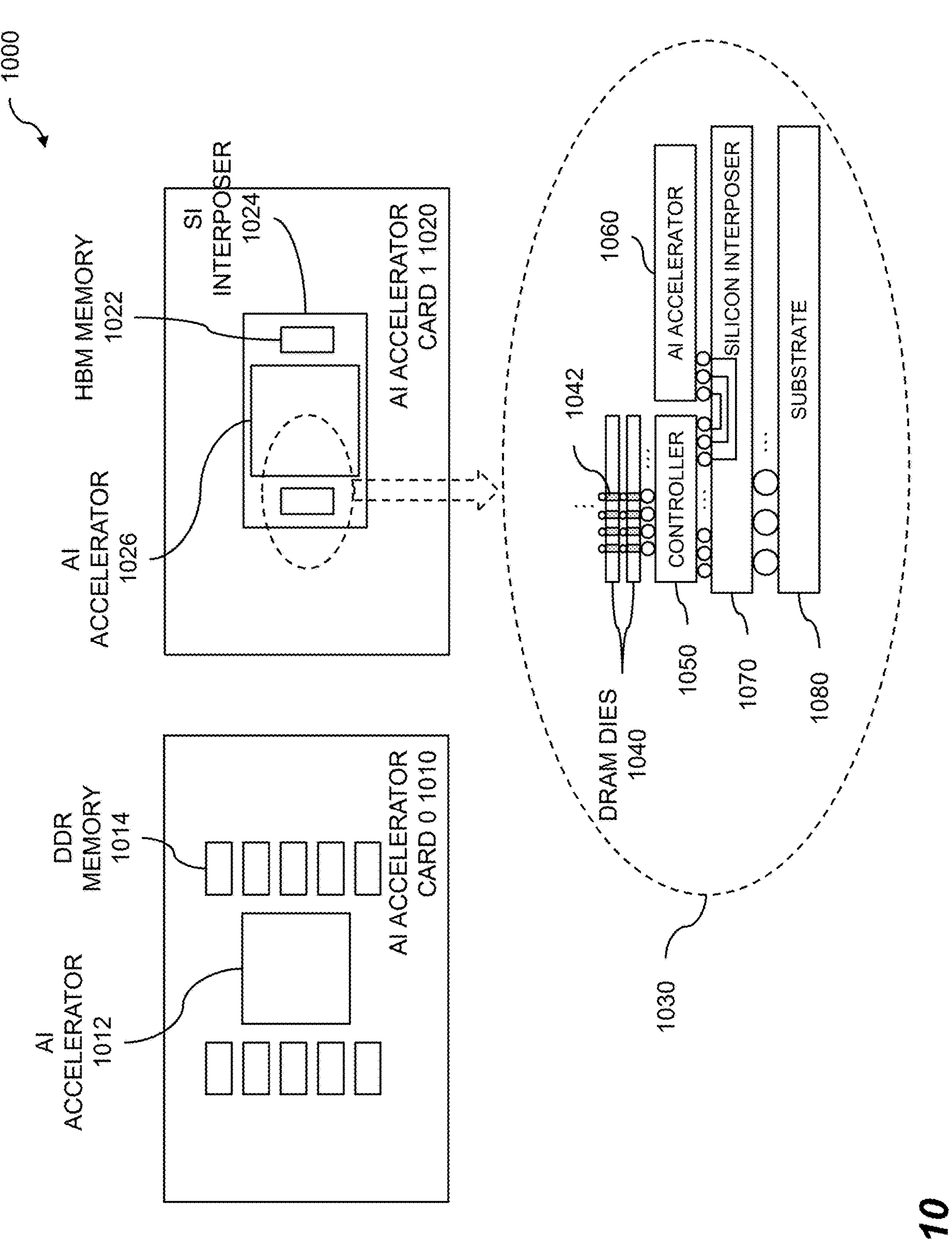
FIG. 10 is an example of enhancing memory bandwidth.

FIG. 10 is an example of enhancing memory bandwidth. As discussed above, modern large neural networks can include billions or even trillions of parameters, requiring many gigabytes of memory or terabytes of memory to simply store the model. Training these large networks can require much more memory as thousands, hundreds of thousands, millions, or more samples of images, videos, texts, papers, sentences, and so on must be presented to the neural network. The results generated by the neural network are then back-propagated through the network to determine adjustments for each of the numerous weights and biases comprising the network. Gradients, intermediate values for weights and biases, and so on must also be stored, further pressuring memory bandwidth. Dividing the processing requirements for training and/or inference by the neural network can be straightforward. For example, a matrix multiply function can be divided into multiple smaller matrix multiply functions, and then assembled to produce the product of the matrix multiply function in a future step. However, handling the bandwidth requirements among processing cores can adversely affect network training time and inference performance. The processing cores can include processing cores within a wafer that enables wafer-scale integration. Enhancing memory bandwidth is supported by wafer-scale integration with a stiffening isometric grid array.

Multiple approaches have been used to increase memory bandwidth including using Static DRAM (SDRAM), Double data rate DRAM (DDR), and so on. The example 1000 shows an AI accelerator card 0 1010. The accelerator includes an AI accelerator 1012. The AI accelerator can include processing cores, custom cores, matrix multiply units, multiply accumulators (MACs), and so on. The AI accelerator can be designed specifically to increase the speed of matrix multiply and other functions associated with the neural network. The AI accelerator card can include DDR memory 1014. The DDR memory can be DDR1, DDR2, DDR3, DDR4, DDR5, and so on. While each generation of DDR memory has improved bandwidth, the memory chips communicate with the AI accelerator only via the AI accelerator card. The DDR memory can comprise any type of memory. While the memory can be physically close to the accelerator, signals must still travel off a silicon die, through a package, across the board, and through another package to the destination die. This can require long cycle times in comparison to the speed of the memory chips and/or AI processors. In addition, the width of the memory buses to and from the AI accelerator chips can be limited due to the need to interface between multiple physical packages.

An improvement in bandwidth can be achieved by 2.5D technology. The example 1000 shows an example of 2.5D technology in AI accelerator card 1 1020. In this case, high bandwidth memory (HBM) 1022 can be included on the same silicon interposer 1024 as the AI accelerator 1026. As shown in 1030, two DRAM dies 1040 can be stacked within the HBM memory. In practice, any number of DRAM dies can be stacked. The DRAM chips can communicate with each other and to a memory controller 1050 via through-silicon vias (TSVs) 1042. Although example 1000 shows DRAM chips, in practice, any type of memory chip can be coupled with 2.5D technology, including LPDDR, GDDR, SRAM, VRAM chips, and so on. The controller and the AI accelerator 1060 can be coupled to the same silicon interposer 1070. The coupling can include micro-bumps, controlled collapse chip connections (C4s), and so on. Communications between the memory controller and the AI accelerator can therefore be accomplished within metal layers of the silicon interposer, improving latency, signal integrity, and/or bandwidth as many more wires can be established within the silicon wafer than would have been possible with a typical packaging interface as shown in 1010. Thus, an extremely high bandwidth bus between the memory and AI accelerator can be established. The silicon interposer can be coupled to a substrate 1080 which can be soldered to AI accelerator card 1. This memory implementation can improve a local bandwidth path between memory to a single AI accelerator (which can include many processors). However, for larger neural networks, bandwidth improvements are also required at the system level between multiple AI accelerators.

Figure 11:
FIG. 11 is a cross-section of wafer scale integration for neural network memory bandwidth.
Figure 11:
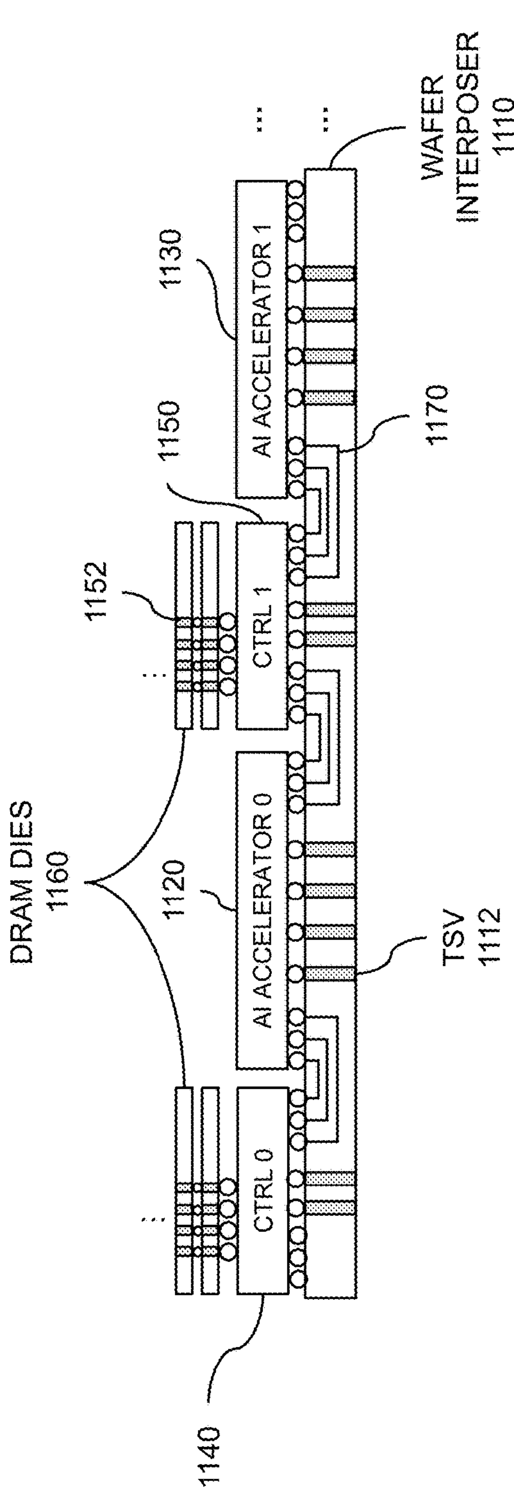

FIG. 11 is a cross-section of wafer scale integration for neural network memory bandwidth. As described above, a lack of robust and sufficient memory bandwidth, especially for large neural networks, can be performance limiting for the neural network. While memory technology such as 2.5D can improve local memory bandwidth, system-wide memory bandwidth is still a significant technical challenge. Wafer-scale integration can significantly improve these bandwidth requirements by reducing separation between the memory and the processors that are accessing it. The wafer-scale integration includes wafer-scale integration with a stiffening isometric grid array. The cross-section 1100 shows a wafer interposer 1110. In a usage example, multiple chips such as AI accelerator chips can be bonded to the wafer interposer. The wafer interposer can comprise a 300 mm wafer, a 200 mm wafer, and so on. The wafer interposer can include any number of through-silicon vias (TSVs) 1112. The TSVs can enable communications between the front side and the back side of the wafer. For example, power can be delivered to the interposer through the back side of the wafer based on the TSVs. To reliably process the TSVs, the back side of the wafer can be ground, polished, and so on to reduce the thickness of the wafer. A plurality of AI accelerators, such as AI accelerator 0 1120 and AI accelerator 1 1130 can be coupled to the wafer interposer. The coupling can include micro-bumps, C4s, and so on. The AI accelerators can be coupled to a plurality of memory controllers, such as memory controller 1140, 1150, and so on. The memory controllers can be based on SDRAM, DDR1, DDR2, DDR3, DDR4, DDR5, HBM, and so on. The memory controllers can be coupled to any number of memory chips. The memory chips can be based on 2.5D technology, which can enable stacking of one or more memory dies 1160. The stack of memory dies can enable a hybrid memory cube (HMC). The memory dies can communicate to other memory dies and to the respective controller by TSVs 1152. The memory can be coupled to one or more AI accelerators by wiring paths 1170 within the wafer interposer. Though AI accelerators and memory chips are shown in cross section 1100, in practice any type of chips including processors, system-on-chips (SoCs), application-specific integrations circuits (ASICs), and so on can be incorporated. The wafer interposer can be processed using a back-end-of-line (BEOL) wafer process which can include any number of metal layers. These metal layer can be used to couple any AI accelerator to any memory controller. The wafer metal layers can provide extremely high bandwidth between any memory controller and any AI processor on the wafer.

The wafer scale integration approach shown in FIG. 11 can address the system level bandwidth requirements necessary for computationally intensive processing applications such as larger neural networks. Recall that neural networks with parameter sizes into the billions or trillions can require significant memory for the model. Recall also that training a large neural network can require a number of training images that can be ten times (or more) the number of parameters. Each of these models must be presented to the network for a forward and back-propagation training pass. Multiple intermediate sets of weights and biases for each node in the neural network can also be stored and maintained though the training process. Further, because the matrix functions for larger neural networks are far too large for any single processor, the processing mentioned above can be divided and sent to many processors, and can span many chips, cards, server racks, or even data centers. While adding additional processors can be straightforward (though expensive), keeping those processors efficiently running can be an extremely difficult task, often gated by memory bandwidth as relevant data must be sent to every processor, regardless of location. Wafer scale integration can reduce bandwidth bottlenecks between many AI accelerators (which can comprise many processor cores, specialized AI cores, accelerators, and so on) and significant amounts of memory. As a result, an entire medium to large size neural network can be fully trained and can run inferences on a single wafer interposer. For larger models, such as ChatGPT, any number of wafer interposers can be coupled together to provide a significant improvement in bandwidth and computation speed.

Figure 12:
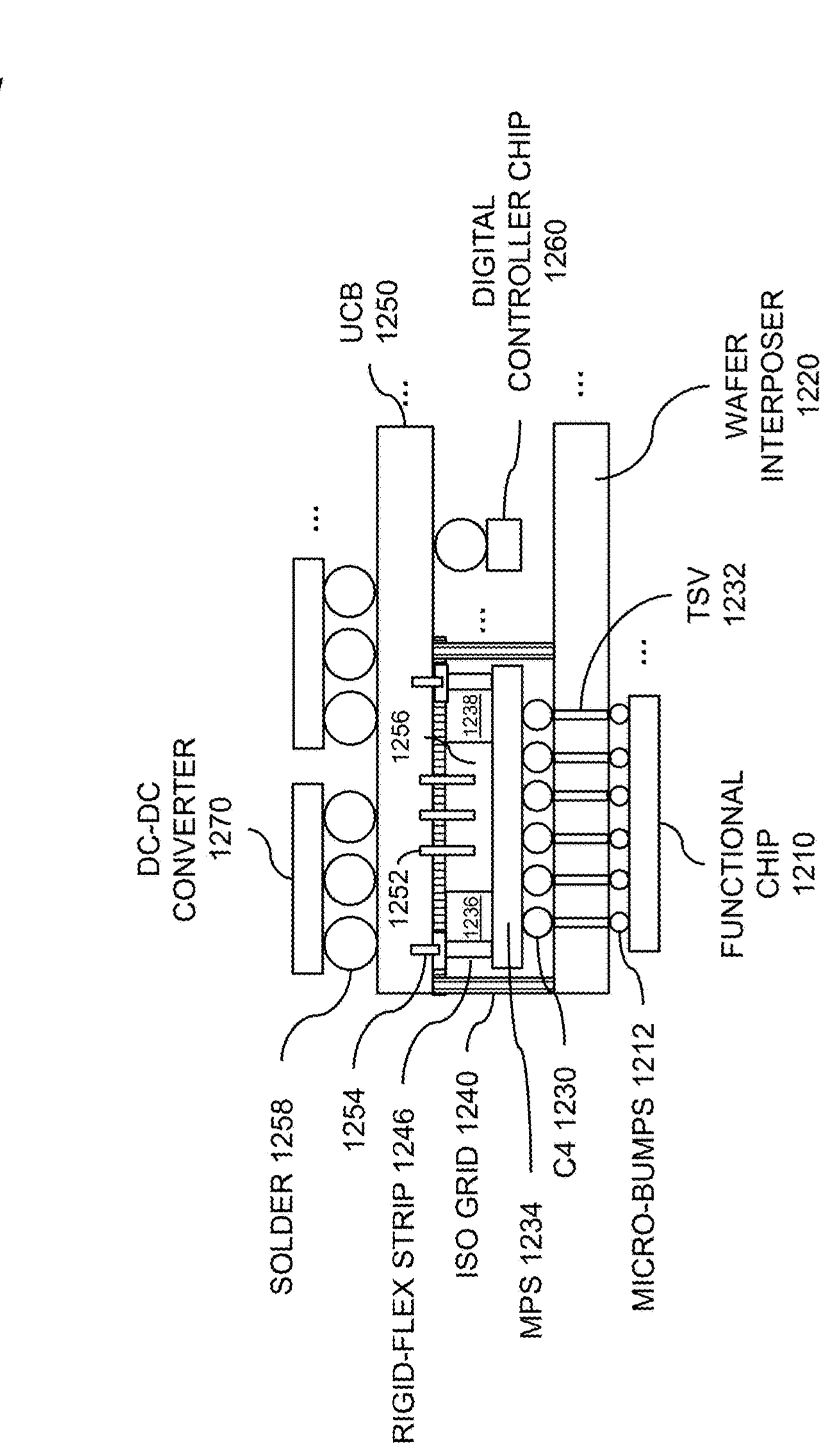
FIG. 12 is a cross-section of an apparatus for wafer-scale integration with stiffening isometric grid array.

FIG. 12 is a cross-section of an apparatus for wafer-scale integration with a stiffening isometric grid array (IGA). The stiffening IGA can be used to secure and support a wafer such as a wafer-scale silicon interposer (WSSI). The WSSI can require security and support because the WSSI can be ground, polished, and so on to a thinness appropriate to enable use of through silicon vias (TSVs). Further, the IGA can maintain planarity of the WSSI. The TSVs can be used to provide connections between a front side of the WSSI and a back side of the WSSI. The WSSI can be used to achieve wafer-scale integration (WSI). The WSSI can be used to mount various elements such as electrical elements and to provide interconnections among the mounted elements. The silicon interposer can include other inorganic materials such as glass. An apparatus for stiffening comprises: a wafer-scale silicon interposer (WSSI), wherein a front side of the WSSI is bonded to a plurality of functional chips, and wherein the WSSI includes a plurality of through-silicon vias (TSVs); an isometric grid array (IGA), wherein a back side of the WSSI is inserted into the IGA, wherein the IGA stiffens the WSSI, and wherein the back side of the WSSI remains accessible via a plurality of open recesses within the IGA; a plurality of modular power substrates (MPSs), wherein the plurality of MPSs is attached to the back side of the WSSI through the plurality of open recesses; and a unified circuit board (UCB), wherein the UCB is mechanically connected to the plurality of MPSs, wherein the UCB includes a plurality of DC-to-DC converters, and wherein the UCB sends DC power to the plurality of functional chips bonded to the WSSI, wherein the sending is based on the plurality of MPSs and the plurality of TSVs.

The apparatus 1200 can include a functional chip 1210. The functional chip can include a processor chip, a multi-core processor chip, a graphics processor chip, a system-on-a-chip, a memory chip, an application-specific integrated circuit (ASIC), an artificial intelligence (AI) or machine learning (ML) accelerator, and so on. The functional chip can include an integrated circuit designed for a flip-chip application. A chip design for a flip-chip application can include a chip for which connections to the chip are accomplished at the top layer of the chip. The connections can include positive and negative DC power connections, data connections, control connections, and so on. The various chip connections can include pads on the top layer of the chip. The functional chip can include a chip that can accomplish a processing function such as a deep learning function. Various techniques can be used to make connections to the top of a functional chip. In a usage example, a technique based on micro-bumps 1212 can be used. A micro-bump can be associated with each connection point or pad on the chip. The micro-bumps can comprise a dense array of connection points or pads. The micro-bumps can include a material appropriate for mounting the chip to a substrate, a board, an interposer, and so on. The micro-bumps can include solder micro-bumps. The micro-bumps can be arranged in a ball grid array (BGA) or some other geometry. Note that the plurality of functional chips create heat during operation. The heat can be due to active current, overcurrent, leakage current, and so on. The heat results from IR heating within the functional chips.

The apparatus 1200 includes a wafer interposer 1220. The wafer interposer can include an interposer that enables wafer-scale integration (WSI). The wafer interposer can include inorganic materials or organic materials. In embodiments, the interposer includes a wafer-scale silicon interposer (WSSI). Other inorganic materials can be used. In a usage example, the wafer interposer can include a glass interposer. Micro-bumps discussed above can be used to mount the one or more functional chips to the wafer interposer. Communications between the functional chips can be accomplished within metal layers of the silicon interposer, thereby reducing latency and parasitics, improving signal integrity and/or bandwidth, etc. The reductions and improvements result from the opportunity for many more wires being established within the silicon wafer compared to what would have been possible with a typical packaging interface. Thus, the WSSI can enable extremely high bandwidth buses and control signals between chips mounted to the WSSI. The WSSI can include one or more optical waveguides. The optical waveguides can enable chip-to-chip communications via light. The optical waveguides can comprise the buses and control signals between chips. The wafer interposer can also be used to attach additional boards, modules, components and so on. The further attachments can be located on the opposite side of the of the wafer interposer from the mounted functional chips. The further wafer interposer attachment can be based on one or more controlled collapse chip connection bumps (C4s) 1230. The wafer interposer can provide connections between the micro-bumps on one side of the wafer interposer and the other side of the wafer interposer. In embodiments, the WSSI includes a plurality of through-silicon vias (TSVs) 1232. The TSVs can provide a connection between the micro-bumps and the C4s. The TSV connections can be used to deliver power to the functional chips through the back side of the WSSI, as is described below.

The apparatus 1200 includes a plurality of modular power substrates (MPSs) 1234. Embodiments include a plurality of modular power substrates (MPSs) wherein the plurality of MPSs is attached to a back side of the WSSI. An MPS can be coupled to one or more elements associated with the WSSI. In embodiments, each MPS in the plurality of MPSs is coupled to one or more functional chips within the plurality of functional chips. An MPS can be based on a form factor. The form factor of the MPS can be associated with or dependent on components mounted to the wafer interposer. In embodiments, the plurality of MPSs is based on a form factor mirroring the corresponding functional chip. The form factor of the MPS can have a 1:1 relationship to the one or more corresponding functional chips or can include other shape factors. The MPSs can be based on a variety of materials. In a usage example, one or more MPSs within the plurality of MPSs comprise an inorganic substrate. An inorganic substrate can include a silicon substrate, a glass substrate, and so on. In another usage example, one or more MPSs within the plurality of MPSs comprise an organic substrate. The organic substrates can include substrates such as printed circuit boards. Recall that the functional chips are mounted to the front or top side of the WSSI. In embodiments, the plurality of MPSs is attached to a back side of the WSSI. Connections between the wafer interposer and the MPS can be accomplished using the C4s described above.

The MPS 1234 can include a plurality of step-down power modules and/or DC-to-DC converters such shown at 1236 and 1238. As shown in a previous diagram, the DC-to-DC converters on an MPS can be placed across the MPS. The DC-to-DC converters on the MPSs can accomplish altering of a DC voltage. The altering the DC voltage can result in a second DC voltage. In a usage example, the power can be altered, wherein altering, by the plurality of MPSs, is accomplished by the DC power that was sent, and wherein the altering is based on a second voltage conversion. The second voltage conversion can include a second DC-to-DC voltage conversion. In embodiments, the second voltage conversion results in a voltage less than a threshold. The threshold can include a voltage appropriate to a voltage required by a functional chip. In embodiments, the threshold can include 1 volt.

The apparatus 1200 can include an isometric grid array (IGA) 1240. The IGA can be placed between the wafer interposer and a circuit board, wafer, card, and so on. The circuit board can include a unified circuit board (UCB) discussed below. In embodiments, a back side of the WSSI is inserted into the IGA, wherein the IGA stiffens the WSSI. Recall that a plurality of through silicon vias (TSVs) can provide connectivity between a front side of the WSSI and a back side of the WSSI. In order for the TSVs to be fabricated and for the TSVs to reliably provide connections, the WSSI can be ground, polished, and so on in order to reduce a thickness of the WSSI. As a result of grinding and polishing, for example, the WSSI can become delicate. In order to reduce the risk of cracking or fracturing the WSSI, the WSSI can be stiffened using the IGA. The IGA can include a plurality of openings where the openings can include a variety of shapes. The opening shapes can include one or more of squares, rectangles, circles, ovals, and so on. The opening shapes can be chosen to match a shape associated with elements coupled to the WSSI. In embodiments, the back side of the WSSI remains accessible via a plurality of open recesses within the IGA. Discussed throughout, a plurality of modular power substrates (MPSs) can be attached to the back side of the WSSI through the plurality of open recesses within the IGA.

The openings in the IGA can be arranged in a variety of patterns. In embodiments, the IGA comprises a grid. The grid can include openings of substantially similar size and shape. Noted previously and throughout, a plurality of modular power substrates (MPSs) is attached to the back side of the WSSI. In order for the MPSs to be attached to the back side of the of the WSSI, in embodiments, the plurality of MPSs is attached to the back side of the WSSI through the plurality of open recesses. Recall that the MPSs can be associated with functional chips, where the functional chips can be bonded to a front side of the WSSI. As a result, the MPSs can be based on a form factor. In embodiments, each MPS within the plurality of MPSs is based on a form factor mirroring one or more corresponding functional chips, within the plurality of functional chips, on the front side of the WSSI. The form factor can be chosen to maximize a quantity of functional chips that can be bonded to a front side of the WSSI. The form factor can further be chosen based on a coefficient of thermal expansion. In order for the MPSs to fit into the IGA, the recesses in the IGA can match a form factor. In embodiments, each open recess within the plurality of open recesses within the IGA matches a form factor of a corresponding MPS in the plurality of MPSs.

Discussed throughout, the isometric grid array stiffens the wafer-scale silicon interposer. The WSSI can greatly benefit from the stiffening by the IGA because the WSSI is ground and/or polished to a thinness that can enable reliable fabrication of a plurality of through silicon vias. The IGA can be in contact with the WSSI. In embodiments, the IGA contacts the back side of the WSSI between each MPS in the plurality of MPSs. The contacting the back side of the WSSI between each MPS can provide excellent stiffening and support of the WSSI without interfering with the elements such as the MPSs that are attached to the WSSI. The IGA can provide additional benefits. In embodiments, the IGA maintains a coplanarity of the WSSI. The coplanarity can be used to reduce strains and improve electrical connections across the WSSI.

Noted previously, the functional chips, the MPSs, the DC-to-DC converters, and other elements such as controller elements generate copious heat when operating. The amount of heat that can be generated by these various elements can be excessive and can cause damage to the elements generating the heat; and to other elements which are bonded, attached, mechanically connected, and so on to the WSSI; etc. Embodiments can further include a cold plate, wherein the cold plate is mounted to the IGA, and the cold plate contacts the plurality of functional chips bonded to the front side of the WSSI. The cold plate can be used to remove heat from the IGA. The mounting of the cold plate to the IGA can be accomplished using a variety of techniques such as using screws, clips, couplings, and so on. In embodiments, the mounting is based on one or more spring-loaded fasteners. The cold plate can include one or more elements for removing heat from the IGA. In embodiments, the cold plate comprises an inlet plate, a jet-plate, and a fin-plate. The cold plate can comprise a variety of materials. In a usage example, the cold plate can comprise copper. The cold plate can receive a coolant that is sent to the cold plate. The cold plate can extract a portion of the generated heat by transferring the heat from the IGA to the coolant. The coolant can then be removed from the cold plate. The heated coolant can be cooled using a variety of techniques such as using a heat exchanger. The cooled coolant can then be cycled back into the cold plate to remove a further portion of the heat from the IGA. In embodiments, an inlet nozzle within the inlet plate is orthogonal to a heat extraction plane. The orthogonal orientation of the inlet nozzle can aid in distribution of the coolant within the cold plate.

The MPS discussed previously can be mechanically connected to a unified control board (UCB) 1250. An MPS can include a connector, where the connector can be used to mechanically connect the MPS to the UCB. The connector can comprise a socket 1256 on the UCB. The socket can comprise a high power socket. The mechanical connection can include one or more plugs, pins, etc. 1252 from the UCB which can be inserted into the socket. In a usage example, the mechanical connection can be based on a high voltage socket, wherein the high voltage socket transfers power from the UCB to the plurality of MPSs. The high voltage socket can be used to provide a first DC voltage that can be converted to a second DC voltage by one or more DC-to-DC converters. The mechanical connection can accommodate a maximum lateral displacement of the UCB due to thermal expansion during operation. The lateral displacement can result from thermal expansion of the WSSI, the UCB, and/or the MPS during operation. In addition to the power connector, the MPS can include a rigid-flex strip 1246. The rigid-flex strip can provide a mechanical connection between the MPS and a UCB. The plurality of rigid-flex strips can provide control signals, data, and so on. In embodiments, the mechanical connection can include a plurality of rigid-flex strips. The plurality of rigid-flex strips can include one or more power control signals from the digital controller chip to the plurality of MPSs. The plurality of rigid-flex strips can carry at least a portion of DC power from the plurality of MPSs to the plurality of functional chips. The rigid-flex strips can include a socket into which one or more plugs, pins, etc., such as 1254, can be inserted to couple the rigid-flex strip to the UCB.

The apparatus 1200 can include a UCB 1250. The UCB can include a plurality of DC-to-DC power converters. As described above, each DC-to-DC power converter in the plurality of DC-to-DC power converters can include a mechanical connection to a respective MPS in the plurality of MPSs. The mechanical connection between each DC-to-DC converter and a respective MPS can enable power transfer, control, and so on. The mechanical connections between the plurality of DC-to-DC converters and the plurality of MPSs can remain reliable when the DC-to-DC converters and the MPSs are operating. The mechanical connection can accommodate a maximum lateral displacement of the UCB due to thermal expansion during operation. The handling maximum lateral displacement is critical to maintaining reliable mechanical connections between and among components, the WSSI, one or more UCBs, one or more MPSs, and so on. Embodiments include a unified circuit board (UCB), wherein the UCB is mechanically connected to a plurality of modular power substrates (MPSs), wherein the UCB includes a plurality of DC-to-DC converters, and wherein the UCB sends DC power to the plurality of functional chips bonded to the WSSI, wherein the sending is based on the plurality of TSVs.

The UCB 1250 can include a digital controller chip 1260. The digital controller chip can control power delivery to the plurality of functional chips. The controlling power delivery can include enabling or disabling power transfer, controlling an input voltage to and an output voltage from a DC-to-DC converter, and the like. Recall that the MPS can include a plurality of rigid-flex strips that can accommodate lateral displacement of the UCB due to thermal expansion during operation. The rigid-flex strips can accomplish other functions. In a usage example, the plurality of rigid-flex strips can include one or more power control signals from the digital controller chip to the plurality of MPSs. The control signals can enable and disable elements such as controller chips and DC-to-DC converters, can provide instructions to controller chips, etc. In a further usage example, the plurality of rigid-flex strips can carry at least a portion of DC power from the plurality of MPSs to the plurality of functional chips.

The apparatus 1200 can include one or more solder bumps 1258. The solder bumps can be positioned on a side of the UCB opposite to the side of the UCB that includes the mechanical connections to the MPSs. The solder bumps can be placed on contacts or pads. The solder bumps can be arranged in an array pattern such as a regular array pattern. The solder bumps can be placed on fewer pads than a regular array. The apparatus 1200 can include a DC-to-DC converter 1270. The DC-to-DC converters can convert a first DC voltage to a second DC voltage. The DC-to-DC converters can be controlled by a control chip associated with the UCB. The DC-to-DC converters can be coupled to the UCB using the solder bumps. A usage example can include matching each DC-to-DC power converter within the plurality of DC-to-DC power converters included on the UCB to one or more respective MPSs in the plurality of MPSs. DC power from a DC-to-DC converter can be sent to a MPS via an interconnect on the UCB. DC power can be fed to the DC-to-DC converters.

Figure 13:
FIG. 13 is a system diagram for wafer-scale integration with stiffening isolation grid array.
Figure 13:
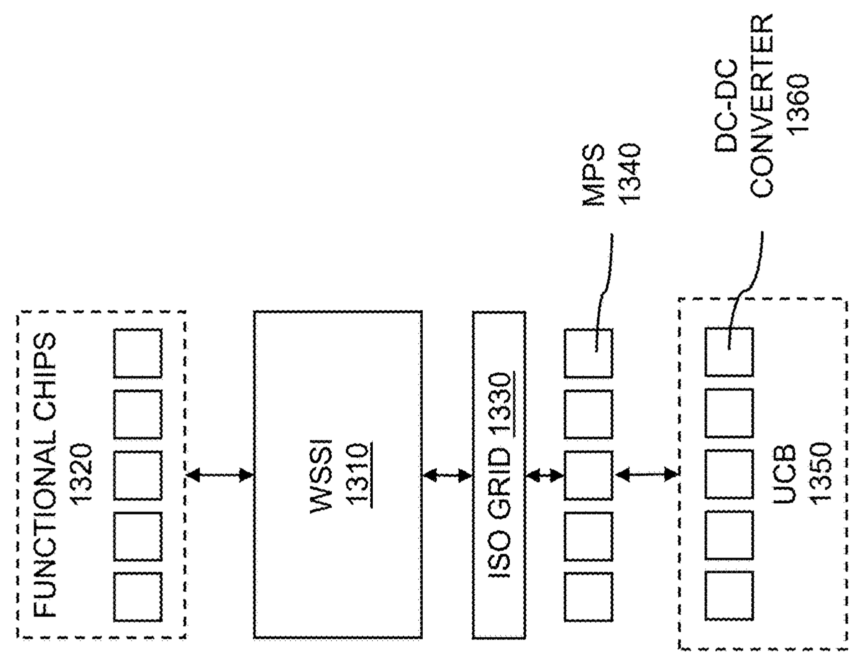

FIG. 13 is a system diagram for wafer-scale integration with a stiffening isolation grid array (IGA). The isolation grid array accomplishes stiffening of a wafer-scale silicon interposer (WSSI). Recall that the WSSI can be bonded to a plurality of functional chips. The functional chips can include processors, multiprocessors, machine learning (ML) processors, graphics processors, memories, and so on. The functional chips can be bonded to a front side of the WSSI. The functional chips can be in communication with elements such as modular power substrates (MPSs) that can be attached to a back side of the WSSI. The communication between the functional chips and the MPSs can be accomplished using through-silicon vias (TSVs). To enable the fabrication of the TSVs and to improve the reliability of the TSVs, the WSSI can be ground, polished, and so on to reduce a thickness of the WSSI. The resulting thin WSSI can be delicate and therefore susceptible to cracking and fracturing. The IGA can provide stiffening to the WSSI to assist with protecting the WSSI from cracks and fractures. The isometric grid enables wafer-scale integration with stiffening.

Disclosed is a system for stiffening comprising: a wafer-scale silicon interposer (WSSI), wherein a front side of the WSSI is bonded to a plurality of functional chips, and wherein the WSSI includes a plurality of through-silicon vias (TSVs); an isometric grid array (IGA), wherein a back side of the WSSI is inserted into the IGA, wherein the IGA stiffens the WSSI, and wherein the back side of the WSSI remains accessible via a plurality of open recesses within the IGA; a plurality of modular power substrates (MPSs), wherein the plurality of MPSs is attached to the back side of the WSSI through the plurality of open recesses; and a unified circuit board (UCB), wherein the UCB is mechanically connected to the plurality of MPSs, wherein the UCB includes a plurality of DC-to-DC converters, wherein the system, when provided DC power, is configured to: send DC power to the plurality of functional chips bonded to the WSSI that was stiffened, wherein the sending is based on the plurality of DC-to-DC converters, the plurality of MPSs, and the plurality of TSVs.

The system 1300 includes a wafer-scale silicon interposer (WSSI) 1310. The WSSI can comprise an inorganic wafer such as a silicon wafer, a glass wafer, and so on. The WSSI can include an organic wafer. A front side of the WSSI is bonded to a plurality of functional chips 1320. The functional chips can include general purpose chips such as processor chips, multiprocessor chips, graphics processor chips, application-specific integrated circuits (ASICS), systems-on-chip (SoCs), memory chips, artificial intelligence (AI) and machine learning (ML) accelerators, and so on. The plurality of functional chips creates prodigious heat during operation. The heat can be due to current provided to the functional chips such as active current, overcurrent, leakage current, and so on. The heat can result from IR drops associated with interconnect, active devices, leakage current, etc. within the functional chips. The functional chips can be bonded to the WSSI via micro-bumps, controlled collapse chip connections (C4s), and so on. The WSSI includes a plurality of through-silicon vias (TSVs). A TSV can include an electrical connection that completely passes through a wafer such as a silicon wafer or a die. The plurality of TSVs is oriented vertically in order to enable connections between the front side of the wafer and the back side of the wafer.

The system 1300 includes an isometric grid array (IGA) 1330. The back side of the WSSI can be inserted into the IGA. The IGA stiffens the WSSI. A cold plate (discussed below) can then be attached to the IGA, thus pressing the cold plate to the functional chips on the front side of the WSSI. This in turn causes pressure on the WSSI toward the IGA. At the same time, the IGA presses toward the WSSI since it is attached to the cold plate. The attaching can be accomplished using one or more screws, clips, locking fasteners, and so on, thus stiffening the WSSI. The stiffening for the WSSI can be particularly critical because the WSSI can be thin. As described above, the WSSI, especially when ground to accommodate TSVs, can be fragile. The IGA can provide support for the WSSI by enhancing stability of the WSSI, stiffness of the WSSI, etc. Enhancing the stiffness of the WSSI can significantly reduce the risk of the WSSI cracking, even under its own weight. The IGA can comprise a grid. The back side of the WSSI can remain accessible via a plurality of open recesses within the IGA. Thus, the IGA can enable stiffness of the WSSI without interfering with elements bonded, mounted, attached, physically connected, etc. to the back side of the WSSI. In embodiments, the IGA maintains a coplanarity of the WSSI. By maintaining coplanarity of the WSSI, risks of cracking and fracturing the WSSI can be reduced. In addition, better electrical contacts can be made across the WSSI.

The system 1300 includes a plurality of modular power substrates (MPSs) 1340. Described previously and throughout, the MPSs can include one or more DC-to-DC converters, a high voltage socket, one or more rigid-flex strips, and so on. In embodiments, each MPS within the plurality of MPSs is based on a form factor mirroring one or more corresponding functional chips, within the plurality of functional chips, on the front side of the WSSI. The one or more MPSs are attached to the back side of the WSSI through the plurality of open recesses. In order for the MPSs to fit the recesses within the IGA, the recesses can match to the MPSs. In embodiments, each open recess within the plurality of open recesses within the IGA matches a form factor of a corresponding MPS in the plurality of MPSs. The matching can be based on one or more parameters. In a usage example, the walls of each recess within the IGA are made sufficiently thin to reduce wasted real estate consumed by the IGA while providing sufficient stiffness to the WSSI. Further, the recesses within the IGA accommodate lateral displacement by the MPSs due to thermal expansion. In embodiments, the IGA maintains a coplanarity of the WSSI. The MPS can provide a second voltage conversion, resulting in an operating voltage appropriate for operating the functional chips. The second voltage conversion can provide an additional voltage appropriate for I/O circuits. In a usage example, the operating voltage can include 1 volt or less, such as 0.85 volts. In a usage example, the additional voltage can include 1.2 volts. The back side of the MPSs can be mounted to the WSSI via micro-bumps, controlled collapse chip connections (C4s), and so on.

The system 1300 includes a unified circuit board (UCB) 1350. The UCB is connected mechanically to the plurality of MPSs. The connection can be accomplished using a variety of connection techniques, where the connection techniques can be accomplished using locking connectors, non-locking connectors, and so on. The connectors can include rigid connectors, flexible connectors, and the like. The mechanical connection can be based on a high power socket (which can be a high voltage socket), one or more rigid-flex strips, and so on. The modularity of the MPSs can allow for movement between the UCB and the WSSI. Movement, such as a linear displacement, can occur due to differences in coefficients of thermal expansion (CTE). The USB can include one or more control circuits. The control circuits can be used to generate control signals to one or more functional chips, enable transfers of data, control DC-to-DC converters, and the like. The UCB includes a plurality of DC-to-DC power converters 1360. The DC-to-DC converters can convert DC power from a high DC voltage range, such as 48 volts to 54 volts, to a lower DC voltage range, such as 12 volts to 13.5 volts. The DC-to-DC converters can be mounted on a unified control board (UCB) 1350. The UCB can provide controls such as control signals, and power such as DC power, to the DC-to-DC converters. The UCB can comprise a single control board. The single control board can include an organic control board or an inorganic control board. The UCB can comprise multiple control boards and/or circuits. The system 1300 is configured to send DC power to the plurality of functional chips bonded to the WSSI that was stiffened. The sending is based on the plurality of DC-to-DC converters, the plurality of MPSs, and the plurality of TSVs. The sending can include the first voltage conversion and the second voltage conversion as described above.

Each of the above methods may be executed on one or more processors on one or more computer systems. Embodiments may include various forms of distributed computing, client/server computing, and cloud-based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general-purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited to neither conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM); an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States, then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A method for stiffening comprising:

accessing a wafer-scale silicon interposer (WSSI), wherein a front side of the WSSI is bonded to a plurality of functional chips, wherein the WSSI includes a plurality of through-silicon vias (TSVs);

stiffening the WSSI, wherein the stiffening is based on an isometric grid array (IGA), wherein the stiffening includes inserting, into the IGA, a back side of the WSSI, and wherein the back side of the WSSI remains accessible via a plurality of open recesses within the IGA;

attaching, to the back side of the WSSI, through the plurality of open recesses within the IGA, a plurality of modular power substrates (MPSs);

connecting mechanically the plurality of MPSs, to a unified control board (UCB), wherein the UCB includes a plurality of DC-to-DC power converters; and sending DC power, by the UCB, to the plurality of functional chips bonded to the front side of the WSSI that was stiffened, wherein the sending is based on the plurality of MPSs and the plurality of TSVs.

2. The method of claim 1 wherein the IGA comprises a grid.

3. The method of claim 2 wherein each MPS within the plurality of MPSs is based on a form factor mirroring one or more corresponding functional chips within the plurality of functional chips on the front side of the WSSI.

4. The method of claim 3 wherein each open recess within the plurality of open recesses within the IGA matches a form factor of each MPS in the plurality of MPSs.

5. The method of claim 4 wherein the IGA contacts the back side of the WSSI between each MPS in the plurality of MPSs.

6. The method of claim 5 wherein the IGA maintains a coplanarity of the WSSI.

7. The method of claim 1 further comprising mounting the IGA to a cold plate, wherein the cold plate contacts the plurality of functional chips bonded to the front side of the WSSI, and wherein the cold plate provides liquid cooling for the plurality of functional chips.

8. The method of claim 7 wherein the mounting is based on one or more spring-loaded fasteners.

9. The method of claim 8 wherein the mounting maintains a coplanarity of the WSSI.

10. The method of claim 7 wherein the cold plate comprises an inlet plate, a jet-plate, and a fin-plate.

11. The method of claim 10 wherein an inlet nozzle within the inlet plate is located orthogonally to a heat extraction plane within the fin-plate.

12. The method of claim 1 wherein the sending includes delivering the DC power, by the UCB, to the plurality of MPSs, wherein the delivering includes a first voltage conversion.

13. The method of claim 12 further comprising transferring the DC power that was delivered, by the plurality of MPSs, to the plurality of functional chips, wherein the transferring includes a second voltage conversion.

14. The method of claim 1 wherein the attaching further comprises coupling each MPS in the plurality of MPSs, to a corresponding functional chip within the plurality of functional chips.

15. The method of claim 14 wherein the plurality of MPSs is based on a form factor mirroring the corresponding functional chip.

16. The method of claim 1 wherein each DC-to-DC converter in the plurality of DC-to-DC power converters is coupled to one or more functional chips in the plurality of functional chips.

17. The method of claim 1 wherein the plurality of functional chips includes one or more artificial intelligence (AI) accelerators.

18. The method of claim 1 wherein the plurality of functional chips includes one or more memory devices.

19. An apparatus for stiffening comprising:

a wafer-scale silicon interposer (WSSI), wherein a front side of the WSSI is bonded to a plurality of functional chips, and wherein the WSSI includes a plurality of through-silicon vias (TSVs);

an isometric grid array (IGA), wherein a back side of the WSSI is inserted into the IGA, wherein the IGA stiffens the WSSI, and wherein the back side of the WSSI remains accessible via a plurality of open recesses within the IGA;

a plurality of modular power substrates (MPSs), wherein the plurality of MPSs is attached to the back side of the WSSI through the plurality of open recesses; and a unified circuit board (UCB), wherein the UCB is mechanically connected to the plurality of MPSs, wherein the UCB includes a plurality of DC-to-DC converters, and wherein the UCB sends DC power to the plurality of functional chips bonded to the WSSI, wherein the sending is based on the plurality of MPSs and the plurality of TSVs.

20. The apparatus of claim 19 wherein the IGA comprises a grid.

21. The apparatus of claim 20 wherein each MPS within the plurality of MPSs is based on a form factor mirroring one or more corresponding functional chips, within the plurality of functional chips, on the front side of the WSSI.

22. The apparatus of claim 21 wherein each open recess within the plurality of open recesses within the IGA matches a form factor of a corresponding MPS in the plurality of MPSs.

23. The apparatus of claim 22 wherein the IGA contacts the back side of the WSSI between each MPS in the plurality of MPSs.

24. The apparatus of claim 23 wherein the IGA maintains a coplanarity of the WSSI.

25. The apparatus of claim 19 further comprising a cold plate, wherein the cold plate is mounted to the IGA, and the cold plate contacts the plurality of functional chips bonded to the front side of the WSSI.

26. The apparatus of claim 25 wherein the mounting is based on one or more spring-loaded fasteners.

27. The apparatus of claim 25 wherein the cold plate comprises an inlet plate, a jet-plate, and a fin-plate.

28. The apparatus of claim 27 wherein an inlet nozzle within the inlet plate is orthogonal to a heat extraction plane.

29. The apparatus of claim 19 wherein each MPS in the plurality of MPSs is coupled to one or more functional chips within the plurality of functional chips.

30. A system for stiffening comprising:

a wafer-scale silicon interposer (WSSI), wherein a front side of the WSSI is bonded to a plurality of functional chips, and wherein the WSSI includes a plurality of through-silicon vias (TSVs);

an isometric grid array (IGA), wherein a back side of the WSSI is inserted into the IGA, wherein the IGA stiffens the WSSI, and wherein the back side of the WSSI remains accessible via a plurality of open recesses within the IGA;

a plurality of modular power substrates (MPSs), wherein the plurality of MPSs is attached to the back side of the WSSI through the plurality of open recesses; and a unified circuit board (UCB), wherein the UCB is connected mechanically to the plurality of MPSs, wherein the UCB includes a plurality of DC-to-DC converters, wherein the system, when provided DC power, is configured to:

send DC power to the plurality of functional chips bonded to the WSSI that was stiffened, wherein the sending is based on the plurality of DC-to-DC converters, the plurality of MPSs, and the plurality of TSVs.

* * * * *